United States Patent
Nishiyama et al.

(10) Patent No.: US 8,286,293 B2
(45) Date of Patent: Oct. 16, 2012

(54) SUBSTRATE CLEANING DEVICE AND SUBSTRATE PROCESSING APPARATUS INCLUDING THE SAME

(75) Inventors: Koji Nishiyama, Kyoto (JP); Joichi Nishimura, Kyoto (JP); Hiroshi Yoshii, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 1055 days.

(21) Appl. No.: 12/179,559

(22) Filed: Jul. 24, 2008

(65) Prior Publication Data
US 2009/0025155 A1  Jan. 29, 2009

(30) Foreign Application Priority Data
Jul. 26, 2007 (JP) .................................. 2007-195034

(51) Int. Cl.
*B08B 1/04* (2006.01)
(52) U.S. Cl. ............................................. 15/77; 15/88.2
(58) Field of Classification Search ............. 15/77, 88.2, 15/88.3, 102; 134/6; *B08B 1/04*
See application file for complete search history.

(56) References Cited

U.S. PATENT DOCUMENTS

| | | | |
|---|---|---|---|
| 6,550,091 B1 | 4/2003 | Radman et al. | |
| 6,651,285 B2 * | 11/2003 | Yeo | 15/77 |
| 6,893,171 B2 | 5/2005 | Fukutomi et al. | |
| 7,300,524 B2 * | 11/2007 | Asano | 134/18 |
| 7,306,002 B2 * | 12/2007 | Kim et al. | 134/184 |
| 7,604,424 B2 * | 10/2009 | Shigemori et al. | 396/611 |
| 7,766,565 B2 * | 8/2010 | Kaneyama | 396/611 |
| 7,913,346 B2 * | 3/2011 | Iwami et al. | 15/77 |
| 7,979,942 B2 * | 7/2011 | Hiraoka et al. | 15/77 |
| 2005/0172430 A1 * | 8/2005 | Yudovsky et al. | 15/77 |
| 2006/0291855 A1 * | 12/2006 | Shigemori et al. | 396/611 |
| 2007/0006895 A1 * | 1/2007 | Iwami et al. | 134/6 |
| 2007/0190437 A1 * | 8/2007 | Kaneyama et al. | 430/30 |

(Continued)

FOREIGN PATENT DOCUMENTS
JP 06-045302 2/1994
(Continued)

OTHER PUBLICATIONS

Hajime Ugajin et al., "New Brush Scrubbing Techniques for a Wafer Bevel. Apex and Edge" Ultra Clean Processing of Semiconductor Surfaces VIII. Solid State Phenomena vol. 134 (2008) pp. 205-208.

(Continued)

*Primary Examiner* — Mark Spisich
*Assistant Examiner* — Michael Jennings
(74) *Attorney, Agent, or Firm* — Kilpatrick Townsend & Stockton LLP

(57) ABSTRACT

A cleaning processing unit includes a spin chuck for horizontally holding a substrate and rotating the substrate around the vertical axis passing through the center of the substrate. A bevel cleaner is disposed outside the spin chuck. The bevel cleaner includes a cleaning brush. The cleaning brush has a shape that is symmetric about its vertical axis, and has an upper bevel cleaning surface, an end surface cleaning surface, and a lower bevel cleaning surface. The end surface cleaning surface is a cylindrical surface having its axis in the vertical direction. The upper bevel cleaning surface extends out from and is inclined upward from the upper end of the end surface cleaning surface, and the lower bevel cleaning surface extends out from and is inclined downward from the lower end of the end surface cleaning surface.

7 Claims, 15 Drawing Sheets

U.S. PATENT DOCUMENTS

2007/0226926 A1    10/2007    Hiraoka et al.

FOREIGN PATENT DOCUMENTS

| | | |
|---|---|---|
| JP | 11-000625 | 1/1999 |
| JP | 2000-049131 A | 2/2000 |
| JP | 2001-176832 A | 6/2001 |
| JP | 2003-151943 | 5/2003 |
| JP | 2003-197592 | 7/2003 |
| JP | 2003-324139 | 11/2003 |
| JP | 2007-012998 A | 1/2007 |
| JP | 2007-019213 | 1/2007 |
| JP | 2007-235089 | 9/2007 |
| JP | 2007-273610 | 10/2007 |
| JP | 2007-273611 | 10/2007 |
| JP | 2007-273612 | 10/2007 |
| WO | WO 99/49504 | 9/1999 |

OTHER PUBLICATIONS

Office Action for Korean Application No. 10-2008-0065408 mailed on Feb. 26, 2010; 7 pages.

Office Action of Chinese Patent Application No. 2008101443196, dated Aug. 21, 2009, 10 pages total.

Office Action for corresponding Japanese application No. 2007-195034 dated Nov. 29, 2011, 4 pages.

* cited by examiner

F I G. 7
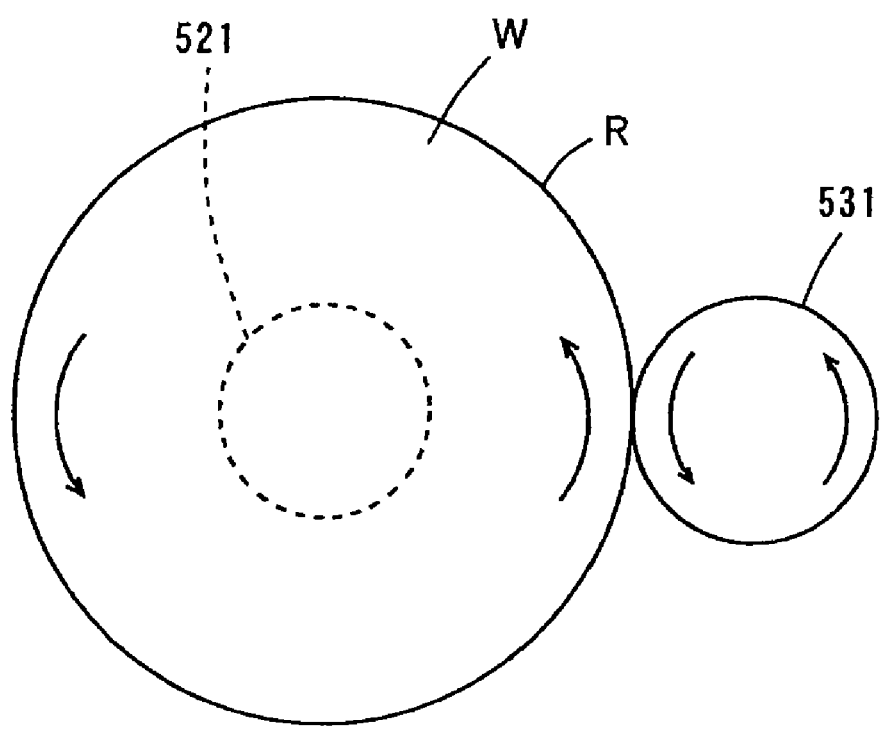

F I G. 1 0
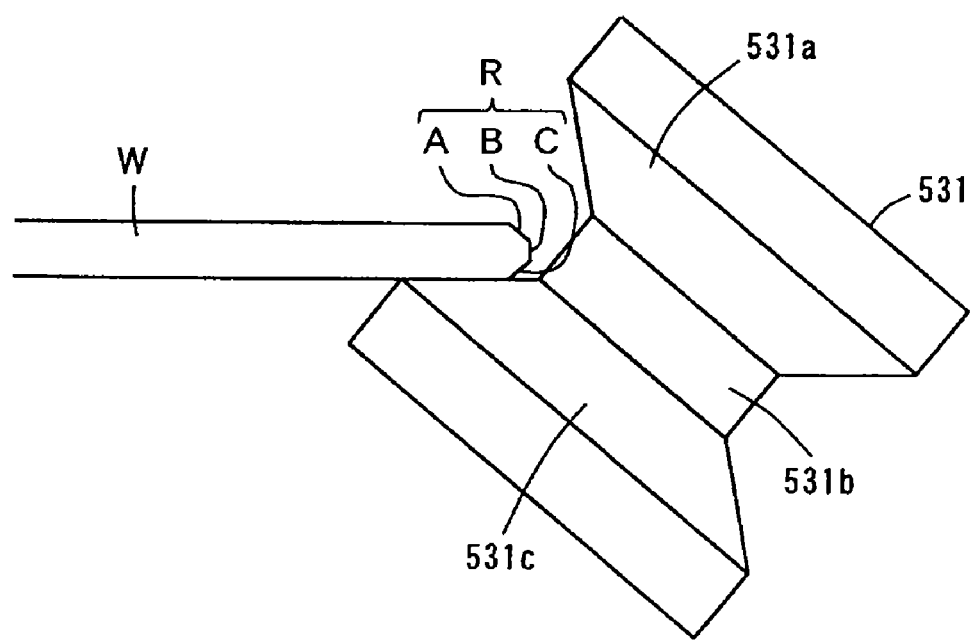

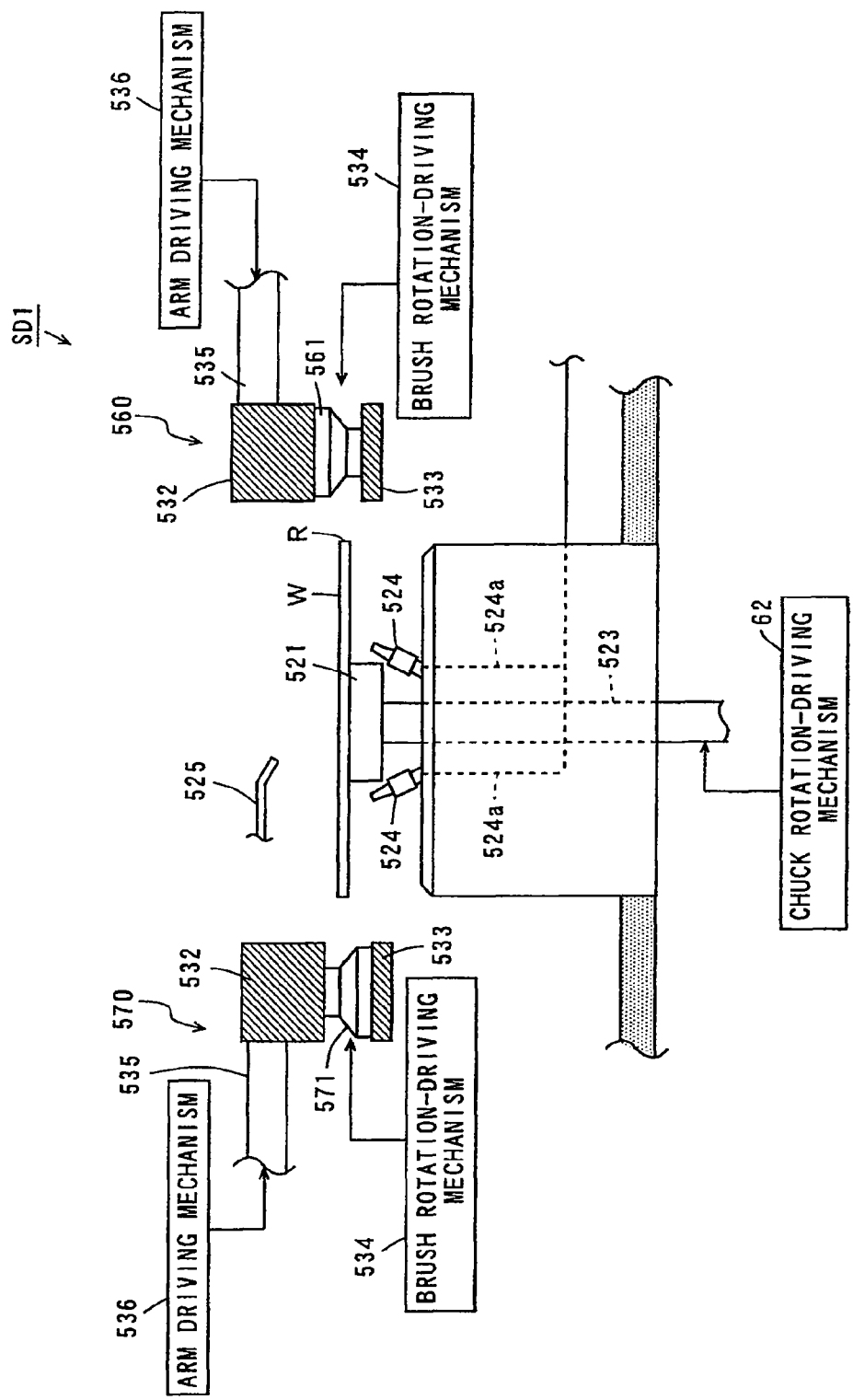
F I G. 13

SUBSTRATE CLEANING DEVICE AND SUBSTRATE PROCESSING APPARATUS INCLUDING THE SAME

CROSS-REFERENCES TO RELATED APPLICATIONS

This application claims priority to Japanese Patent Application 2007-195034, filed Jul. 26, 2007. The disclosure of JP 2007-195034 is hereby incorporated by reference its entirety for all purposes.

BACKGROUND OF THE INVENTION

1. Field of the Invention

The present invention relates to a substrate cleaning device that cleans substrates and a substrate processing apparatus including the same.

2. Description of the Background Art

Substrate processing apparatuses are used to subject various types of substrates such as semiconductor substrates, substrates for liquid crystal displays, plasma displays, optical disks, magnetic disks, and magneto-optical disks, photomasks, and other substrates to various types of processing.

Such a substrate processing apparatus generally subjects a single substrate to a plurality of different types of processing successively. A substrate processing apparatus as described in JP 2003-324139 A includes an indexer block, an anti-reflection film processing block, a resist film processing block, a development processing block, and an interface block. An exposure device is arranged adjacent to the interface block as an external device separate from the substrate processing apparatus.

In the above-mentioned substrate processing apparatus, a substrate carried thereinto from the indexer block is transported to the exposure device through the interface block after being subjected to anti-reflection film formation and resist film coating processing in the anti-reflection film processing block and the resist film processing block. After the resist film on the substrate is subjected to exposure processing in the exposure device, the substrate is transported to the development processing block through the interface block. After the resist film on the substrate is subjected to development processing to form a resist pattern thereon in the development processing block, the substrate is transported to the indexer block.

With recent increases in density and integration of devices, making finer resist patterns has become an important problem. Conventional exposure devices have generally performed exposure processing by reduction-projecting reticle patterns on substrates through projection lenses. In such conventional exposure devices, however, the line widths of exposure patterns are determined by the wavelengths of light sources of the exposure devices. Therefore, making finer resist patterns has had limitations.

Therefore, as projection exposure methods allowing for finer exposure patterns, a liquid immersion method is suggested (see, e.g., WO99/49504 pamphlet). In the projection exposure device according to the WO99/49504 pamphlet, an area between a projection optical system and a substrate is filled with a liquid, resulting in a shorter wavelength of exposure light on a top surface of the substrate. This allows for a finer exposure pattern.

In the projection exposure device according to the above-mentioned WO99/49504 pamphlet, however, exposure processing is performed with the substrate and the liquid brought into contact with each other. When a contaminant adheres to the substrate before the exposure processing, the contaminant is mixed into the liquid.

Although the substrate is subjected to various types of film formation processing before the exposure processing, an end portion of the substrate may, in some cases, be contaminated in the process of the film formation processing. When the substrate is subjected to the exposure processing with an end portion of the substrate contaminated, a lens of the exposure device may be contaminated, resulting in a defective dimension and a defective shape of an exposure pattern.

SUMMARY OF THE INVENTION

An object of the present invention is to provide a substrate cleaning device that can sufficiently clean an unnecessary portion in an end portion of a substrate and a substrate processing apparatus including the same.

According to an aspect of the present invention, a substrate processing apparatus that is arranged adjacent to an exposure device includes a processing section for subjecting a substrate to processing, and an interface provided adjacent to one end of the processing section for receiving and transferring the substrate between the processing section and the exposure device, in which at least one of the processing section and the interface includes a substrate cleaning device that cleans the substrate before exposure processing, the substrate cleaning device includes a substrate rotation holding device that rotates the substrate while holding the substrate, an end portion cleaning brush provided such that it can come into contact with an end portion of the substrate held in the substrate rotation holding device, a brush rotating mechanism that rotates the end portion cleaning brush around a rotating shaft in a direction substantially perpendicular to one surface of the substrate held in the substrate rotation holding device, the end portion cleaning brush has a tapered first cleaning surface that can come into contact with a bevel region on the side of the one surface of the substrate held by the substrate rotation holding device, a cylindrical second cleaning surface that can come into contact with an end surface region of the substrate held by the substrate rotation holding device, and a tapered third cleaning surface that can come into contact with a bevel region on the side of the other surface of the substrate held by the substrate rotation holding device, and the first, second, and third cleaning surfaces are integrally provided with the rotating shaft as its center.

In the substrate processing apparatus, the processing section subjects the substrate to predetermined processing, and the interface receives and transfers the substrate from the processing section to the exposure device. After the exposure device subjects the substrate to the exposure processing, the interface returns the substrate after the exposure processing from the exposure device to the processing section. Before or after the exposure processing by the exposure device, the substrate cleaning device cleans the substrate.

In the substrate cleaning device, the substrate rotates while being held by the substrate rotation holding device. The brush rotating mechanism rotates the end portion cleaning brush around the rotating shaft in the direction substantially perpendicular to the one surface of the substrate held by the substrate rotation holding device. In the state, the end portion cleaning brush comes into contact with the end portion of the substrate.

The first cleaning surface of the end portion cleaning brush comes into contact with the bevel region on the side of the one surface of the substrate held by the substrate rotation holding device, so that the bevel region on the side of the one surface of the substrate is cleaned. The second cleaning surface of the end portion cleaning brush comes into contact with the end surface region of the substrate held by the substrate rotation holding device, so that the end surface region of the substrate is cleaned. Furthermore, the third cleaning surface of the end portion cleaning brush comes into contact with the bevel region on the side of the other surface of the substrate held by the substrate rotation holding device, so that the bevel region on the side of the other surface of the substrate is cleaned.

This allows a contaminant that adheres to the bevel region on the side of the one surface, the end surface region, and the bevel region on the side of the other surface of the substrate to be sufficiently removed. When the substrate before the exposure processing is cleaned, it is possible to reliably prevent contamination in the exposure device due to contamination of the end portion of the substrate while preventing a defective dimension and a defective shape of an exposure pattern. Furthermore, when the substrate after the exposure processing is cleaned, the development processing can be performed with the end portion of the substrate kept sufficiently clean. This can reliably prevent development performance from being degraded due to the contamination of the end portion of the substrate.

The end portion cleaning brush may further have an annular plane-shaped fourth cleaning surface that can come into contact with a peripheral portion of the other surface of the substrate held by the substrate rotation holding device, and the fourth cleaning surface may be provided integrally with the first, second, and third cleaning surfaces with the rotating shaft as its center.

In this case, the fourth cleaning surface of the end portion cleaning brush comes into contact with the peripheral portion of the other surface of the substrate held by the substrate rotation holding device, so that the peripheral portion of the other surface of the substrate is cleaned. This allows the contaminant that adheres to the peripheral portion of the other surface of the substrate to be sufficiently removed.

At least one of the processing section and the interface may include a reversing device that reverses the one surface and the other surface of the substrate, and the substrate cleaning device may further include a surface cleaning brush that is provided integrally with the end portion cleaning brush and can come into contact with the other surface of the substrate held in the substrate rotation holding device after the reverse by the reversing device.

In this case, after the reversing device reverses the one surface and the other surface of the substrate, the surface cleaning brush comes into contact with the other surface of the substrate held in the substrate rotation holding device, so that the other surface of the substrate is cleaned. This allows the contaminant that adheres to the other surface of the substrate to be sufficiently removed.

According to another aspect of the present invention, a substrate processing apparatus that is arranged adjacent to an exposure device includes a processing section for subjecting a substrate to processing, and an interface provided adjacent to one end of the processing section for receiving and transferring the substrate between the processing section and the exposure device, in which at least one of the processing section and the interface includes a substrate cleaning device that cleans the substrate before exposure processing, the substrate cleaning device includes a substrate rotation holding device that rotates the substrate while holding the substrate, an end portion cleaning brush provided such that it can come into contact with an end portion of the substrate held in the substrate rotation holding device, and a brush rotating mechanism that rotates the end portion cleaning brush around a rotating shaft in a direction inclined to one surface of the substrate held in the substrate rotation holding device, and the end portion cleaning brush has a tapered first cleaning surface that can come into contact with an end surface region of the substrate held by the substrate rotation holding device, a cylindrical second cleaning surface that can come into contact with a bevel region on the side of the one surface of the substrate held by the substrate rotation holding device, and a tapered third cleaning surface that can come into contact with a peripheral portion of the one surface of the substrate held by the substrate rotation holding device, and the first, second, and third cleaning surfaces are integrally provided with the rotating shaft as its center.

In the substrate processing apparatus, the processing section subjects the substrate to predetermined processing, and the interface receives and transfers the substrate from the processing section to the exposure device. After the exposure device subjects the substrate to the exposure processing, the interface returns the substrate after the exposure processing from the exposure device to the processing section. Before or after the exposure processing by the exposure device, the substrate cleaning device cleans the substrate.

In the substrate cleaning device, the substrate rotates while being held by the substrate rotation holding device. The brush rotating mechanism rotates the end portion cleaning brush around the rotating shaft in the direction inclined to the one surface of the substrate held by the substrate rotation holding device. In the state, the end portion cleaning brush comes into contact with the end portion of the substrate.

The first cleaning surface of the end portion cleaning brush comes into contact with the end surface region of the substrate held by the substrate rotation holding device, so that the end surface region of the substrate is cleaned. The second cleaning surface of the end portion cleaning brush comes into contact with the bevel region on the side of the one surface of the substrate, so that the bevel region on the side of the one surface of the substrate is cleaned. The third cleaning surface of the end portion cleaning brush comes into contact with the peripheral portion of the one surface of the substrate held by the substrate rotation holding device, so that the peripheral portion of the one surface of the substrate is cleaned.

This allows a contaminant that adheres to the end surface region, the bevel region on the side of the one surface, and the peripheral portion of the one surface of the substrate to be sufficiently removed. This can reliably prevent, when the substrate before the exposure processing is cleaned, contamination in the exposure device due to contamination of the end portion of the substrate while preventing a defective dimension and a defective shape of an exposure pattern. Furthermore, when the substrate after the exposure processing is cleaned, the development processing can be performed with the end portion of the substrate kept sufficiently clean. This can reliably prevent development performance from being degraded due to the contamination of the end portion of the substrate.

According to still another aspect of the present invention, a substrate processing apparatus that is arranged adjacent to an exposure device includes a processing section for subjecting a substrate to processing, and an interface provided adjacent to one end of the processing section for receiving and transferring the substrate between the processing section and the exposure device, in which at least one of the processing section and the interface includes a substrate cleaning device that cleans the substrate before exposure processing, the substrate cleaning device includes a substrate rotation holding device that rotates the substrate while holding the substrate, first and second cleaning brushes that are provided such that they can come into contact with an end portion of the substrate held in the substrate rotation holding device, and first and second brush rotating mechanisms that respectively rotate the first and second cleaning brushes around a rotating shaft in a direction substantially perpendicular to one surface of the substrate held in the substrate rotation holding device, the first cleaning brush has a tapered first cleaning surface that can come into contact with a bevel region on the side of the one surface of the substrate held by the substrate rotation holding device, and the second cleaning brush has a tapered second cleaning surface that can come into contact with a bevel region on the side of the other surface of the substrate held by the substrate rotation holding device.

In the substrate processing apparatus, the processing section subjects the substrate to predetermined processing, and the interface receives and transfers the substrate from the processing section to the exposure device. After the exposure device subjects the substrate to the exposure processing, the interface returns the substrate after the exposure processing from the exposure device to the processing section. Before or after the exposure processing by the exposure device, the substrate cleaning device cleans the substrate.

In the substrate cleaning device, the substrate rotates while being held by the substrate rotation holding device. The first brush rotating mechanism rotates the first cleaning brush while the second brush rotating mechanism rotates the second cleaning brush around the rotating shaft in the direction substantially perpendicular to the one surface of the substrate held by the substrate rotation holding device. In the state, the first and second cleaning brushes come into contact with the end portion of the substrate.

The first cleaning surface of the first cleaning brush comes into contact with the bevel region on the side of the one surface of the substrate held by the substrate rotation holding device, so that the bevel region on the side of the one surface of the substrate is cleaned. Furthermore, the second cleaning surface of the second cleaning brush comes into contact with the bevel region on the side of the other surface of the substrate held by the substrate rotation holding device, so that the bevel region on the side of the other surface of the substrate is cleaned.

In this case, the bevel region on the side of the one surface of the substrate and the bevel region on the side of the other surface thereof can be simultaneously cleaned, which allows a contaminant that adheres to the bevel regions on the side of the one surface and the side of the other surface of the substrate to be quickly and sufficiently removed. This can reliably prevent, when the substrate before the exposure processing is cleaned, contamination in the exposure device due to contamination of the end portion of the substrate while preventing a defective dimension and a defective shape of an exposure pattern. Furthermore, when the substrate after the exposure processing is cleaned, the development processing can be performed with the end portion of the substrate kept sufficiently clean. This can reliably prevent development performance from being degraded due to the contamination of the end portion of the substrate.

At least one of the first and second cleaning brushes may further have a cylindrical third cleaning surface that can come into contact with an end surface region of the substrate held by the substrate rotation holding device, and the third cleaning surface may be provided integrally with the first or second cleaning surface with the rotating shaft as its center.

In this case, the third cleaning surface is brought into contact with the end surface region of the substrate held by the substrate rotation holding device, which allows the end surface region of the substrate to be cleaned. This allows the contaminant that adheres to the end surface region of the substrate to be sufficiently removed.

The substrate cleaning device may further include a first cleaning liquid supplier that supplies a cleaning liquid to the one surface of the substrate held by the substrate rotation holding device.

In this case, the one surface of the substrate is cleaned by the cleaning liquid. Furthermore, a centrifugal force developed by the rotation of the substrate causes the cleaning liquid to be introduced into the end portion of the substrate along the one surface of the substrate. This allows the end portion of the substrate to be more effectively cleaned.

The substrate cleaning device may further include a second cleaning liquid supplier that supplies a cleaning liquid to the other surface of the substrate held by the substrate rotation holding device.

In this case, the other surface of the substrate is cleaned by the cleaning liquid. Furthermore, a centrifugal force developed by the rotation of the substrate causes the cleaning liquid to be introduced into the end portion of the substrate along the other surface of the substrate. This allows the end portion of the substrate to be more effectively cleaned.

According to still another aspect of the present invention, a substrate cleaning device includes a substrate rotation holding device that rotates the substrate while holding the substrate, and a cleaning brush that is provided such that it can come into contact with an end portion of the substrate held in the substrate rotation holding device, and a brush rotating mechanism that rotates the cleaning brush around a rotating shaft in a direction substantially perpendicular to one surface of the substrate held in the substrate rotation holding device, in which the cleaning brush has a tapered first cleaning surface that can come into contact with a bevel region on the side of the one surface of the substrate held by the substrate rotation holding device, a cylindrical second cleaning surface that can come into contact with an end surface region of a substrate held by the substrate rotation holding device, a tapered third cleaning surface that can come into contact with a bevel region on the side of the other surface of the substrate held by the substrate rotation holding device, and an annular plane-shaped fourth cleaning surface that can come into contact with a peripheral portion of the other surface of the substrate held by the substrate rotation holding device, and the first, second, third and fourth cleaning surfaces are integrally provided with the rotating shaft as its center.

In the substrate cleaning device, the substrate rotates while being held by the substrate rotation holding device. The brush rotating mechanism rotates the end portion cleaning brush around the rotating shaft in the direction substantially perpendicular to the one surface of the substrate held by the substrate rotation holding device. In the state, the end portion cleaning brush comes into contact with the end portion of the substrate.

The first cleaning surface of the end portion cleaning brush comes into contact with the bevel region on the side of the one surface of the substrate held by the substrate rotation holding device, so that the bevel region on the side of the one surface of the substrate is cleaned. The second cleaning surface of the end portion cleaning brush comes into contact with the end surface region of the substrate held by the substrate rotation holding device, so that the end surface region of the substrate is cleaned. Furthermore, the third cleaning surface of the end portion cleaning brush comes into contact with the bevel region on the side of the other surface of the substrate held by the substrate rotation holding device, so that the bevel region on the side of the other surface of the substrate is cleaned. Furthermore, the fourth cleaning surface of the end portion cleaning brush comes into contact with the peripheral portion of the other surface of the substrate held by the substrate rotation holding device, so that the peripheral portion of the other surface of the substrate is cleaned.

This allows a contaminant that adheres to the bevel region on the side of the one surface, the end surface region, the bevel region on the side of the other surface, and the peripheral portion of the other surface of the substrate to be sufficiently removed.

According to still another aspect of the present invention, a substrate cleaning device includes a substrate rotation holding device that rotates a substrate while holding the substrate, an end portion cleaning brush provided such that it can come into contact with an end portion of the substrate held in the substrate rotation holding device, a surface cleaning brush that is provided integrally with the end portion cleaning brush and can come into contact with one surface of the substrate held in the substrate rotation holding device, and a brush rotating mechanism that rotates the end portion cleaning brush around a rotating shaft in a direction substantially perpendicular to the one surface of the substrate held in the substrate rotation holding device, in which the end portion cleaning brush has a tapered first cleaning surface that can come into contact with a bevel region on the side of the one surface of the substrate held by the substrate rotation holding device, a cylindrical second cleaning surface that can come into contact with an end surface region of the substrate held by the substrate rotation holding device, a tapered third cleaning surface that can come into contact with a bevel region on the side of the other surface of the substrate held by the substrate rotation holding device, and the first, second, and third cleaning surfaces are integrally provided with the rotating shaft as its center.

In the substrate cleaning device, the substrate rotates while being held by the substrate rotation holding device. The brush rotating mechanism rotates the end portion cleaning brush around the rotating shaft in the direction substantially perpendicular to the one surface of the substrate held by the substrate rotation holding device. The end portion cleaning brush comes into contact with the end portion of the substrate held by the substrate rotation holding device, and the surface cleaning brush comes into contact with the one surface of the substrate held by the substrate rotation holding device.

The first cleaning surface of the end portion cleaning brush comes into contact with the bevel region on the side of the one surface of the substrate held by the substrate rotation holding device, so that the bevel region on the side of the one surface of the substrate is cleaned. The second cleaning surface of the end portion cleaning brush comes into contact with the end surface region of the substrate held by the substrate rotation holding device, so that the end surface region of the substrate is cleaned. Furthermore, the third cleaning surface of the end portion cleaning brush comes into contact with the bevel region on the side of the other surface of the substrate held by the substrate rotation holding device, so that the bevel region on the side of the other surface of the substrate is cleaned. The surface cleaning brush comes into contact with the one surface of the substrate held by the substrate rotation holding device, so that the one surface of the substrate is cleaned.

This allows a contaminant that adheres to the one surface, the bevel region on the side of the one surface, the end surface region, and the bevel region on the side of the other surface of the substrate to be sufficiently removed.

According to still another aspect of the present invention, a substrate cleaning device includes a substrate rotation holding device that rotates a substrate while holding a substrate, an end portion cleaning brush provided such that it can come into contact with an end portion of the substrate held in the substrate rotation holding device, and a brush rotating mechanism that rotates the end portion cleaning brush around a rotating shaft in a direction inclined to one surface of the substrate held in the substrate rotation holding device, in which the end portion cleaning brush has a tapered first cleaning surface that can come into contact with an end surface region of the substrate held by the substrate rotation holding device, a cylindrical second cleaning surface that can come into contact with a bevel region on the side of the one surface of the substrate held by the substrate rotation holding device, and a tapered third cleaning surface that can come into contact with a peripheral portion of the one surface of the substrate held by the substrate rotation holding device, and the first, second, and third cleaning surfaces are integrally provided with the rotating shaft as its center.

In the substrate cleaning device, the substrate rotates while being held by the substrate rotation holding device. The brush rotating mechanism rotates the end portion cleaning brush around the rotating shaft in the direction inclined to the one surface of the substrate held by the substrate rotation holding device. In the state, the end portion cleaning brush comes into contact with the end portion of the substrate.

The first cleaning surface of the end portion cleaning brush comes into contact with the end surface region of the substrate held by the substrate rotation holding device, so that the end surface region of the substrate is cleaned. The second cleaning surface of the end portion cleaning brush comes into contact with the bevel region on the side of the one surface of the substrate held by the substrate rotation holding device, so that the bevel region on the side of the one surface of the substrate is cleaned. The third cleaning surface of the end portion cleaning brush comes into contact with the peripheral portion of the one surface of the substrate held by the substrate rotation holding device, so that the peripheral portion of the one surface of the substrate is cleaned.

This allows a contaminant that adheres to the end surface region, the bevel region on the side of the one surface, and the peripheral portion of the one surface of the substrate to be sufficiently removed.

According to still another aspect of the present invention, a substrate cleaning device includes a substrate rotation holding device that rotates a substrate while holding the substrate, first and second cleaning brushes provided such that they can come into contact with an end portion of the substrate held in the substrate rotation holding device, and first and second brush rotating mechanisms that respectively rotate the first and second cleaning brushes around a rotating shaft in a direction substantially perpendicular to one surface of the substrate held in the substrate rotation holding device, in which the first cleaning brush has a tapered first cleaning surface that can come into contact with a bevel region on the side of the one surface of the substrate held by the substrate rotation holding device, the second cleaning brush has a tapered second cleaning surface that can come into contact with a bevel region on the side of the other surface of the substrate held by the substrate rotation holding device, at least one of the first and second cleaning brushes further has a cylindrical third cleaning surface that can come into contact with an end surface region of the substrate held by the substrate rotation holding device, and the third cleaning surface is provided integrally with the first or second cleaning surface with the rotating shaft as its center.

In the substrate cleaning device, the substrate rotates while being held by the substrate rotation holding device. The first brush rotating mechanism rotates the first cleaning brush while the second brush rotating mechanism rotates the second cleaning brush around the rotating shaft in the direction substantially perpendicular to the one surface of the substrate held by the substrate rotation holding device. In the state, the first and second cleaning brushes come into contact with the end portion of the substrate.

The first cleaning surface of the first cleaning brush comes into contact with the bevel region on the side of the one surface of the substrate held by the substrate rotation holding device, so that the bevel region on the side of the one surface of the substrate is cleaned. The second cleaning surface of the second cleaning brush comes into contact with the bevel region on the side of the other surface of the substrate held by the substrate rotation holding device, so that the bevel region on the side of the other surface of the substrate is cleaned.

In this case, the bevel region on the side of the one surface of the substrate and the bevel region on the side of the other surface thereof can be simultaneously cleaned, which allows a contaminant that adheres to the bevel regions on the side of the one surface and the other surface of the substrate to be quickly and sufficiently removed.

The third cleaning surface provided on at least one of the first and second cleaning brushes comes into contact with the end surface region of the substrate held by the substrate rotation holding device, so that the end surface region of the substrate is cleaned. This allows a contaminant that adheres to the end surface region of the substrate to be sufficiently removed. Furthermore, the end surface region of the substrate can be also simultaneously cleaned in addition to the bevel region on the side of the one surface of the substrate and the bevel region on the side of the other surface thereof.

The substrate cleaning device may further include a first cleaning liquid supplier that supplies a cleaning liquid to the one surface of the substrate held by the substrate rotation holding device.

In this case, the one surface of the substrate is cleaned by the cleaning liquid. Furthermore, a centrifugal force developed by the rotation of the substrate causes the cleaning liquid to be introduced into the end portion of the substrate along the one surface of the substrate. This allows the end portion of the substrate to be more effectively cleaned.

The substrate cleaning device may further include a second cleaning liquid supplier that supplies a cleaning liquid to the other surface of the substrate held by the substrate rotation holding device.

In this case, the other surface of the substrate is cleaned by the cleaning liquid. Furthermore, a centrifugal force developed by the rotation of the substrate causes the cleaning liquid to be introduced into the end portion of the substrate along the other surface of the substrate. This allows the end portion of the substrate to be more effectively cleaned.

According to the present invention, a necessary portion in the end portion of the substrate can be sufficiently cleaned.

Other features, elements, characteristics, and advantages of the present invention will become more apparent from the following description of preferred embodiments of the present invention with reference to the attached drawings.

BRIEF DESCRIPTION OF THE DRAWINGS

FIG. 7 is a plan view showing the respective rotation directions of a substrate and a cleaning brush;

FIG. 10 is a diagram for explaining cleaning processing of a bevel portion of a substrate in a cleaning processing unit shown in FIG. 9;

FIG. 13 is a diagram showing a cleaning processing unit including a bevel cleaner according to still another example;

DETAILED DESCRIPTION OF THE INVENTION

A substrate processing apparatus according to an embodiment of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

(1) Configuration of Substrate Processing Apparatus

Figure 1:
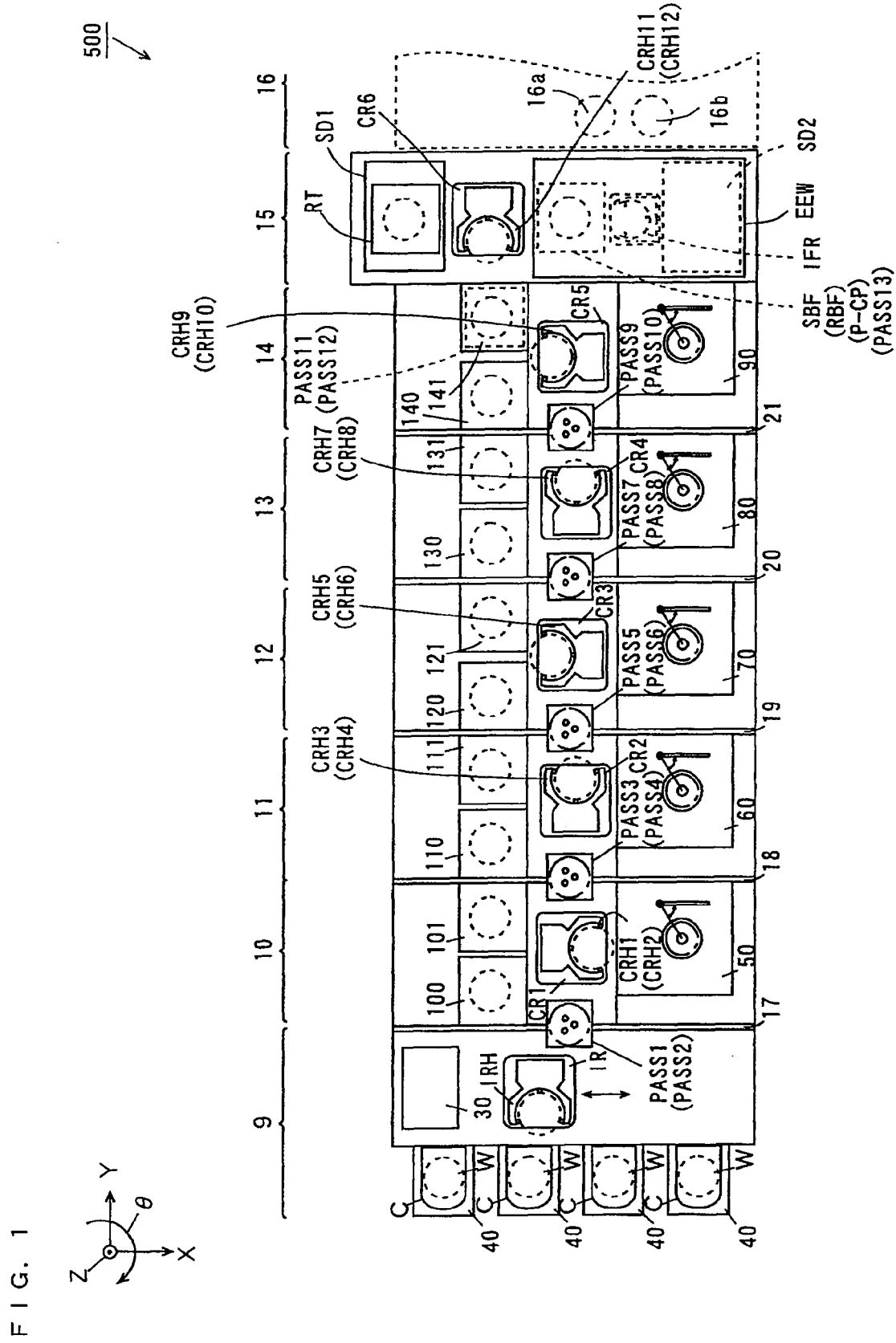
FIG. 1 is a plan view of a substrate processing apparatus according to an embodiment of the present invention.

FIG. 1 is a plan view of a substrate processing apparatus according to an embodiment of the present invention. FIG. 1 and FIGS. 2 to 4 described later are accompanied by arrows that respectively indicate X, Y, and Z directions perpendicular to one another for clarity of a positional relationship. The X and Y directions are perpendicular to each other within a horizontal plane, and the Z direction corresponds to the vertical direction. In each of the directions, the direction of an arrow is defined as the + direction, and the opposite direction is defined as the − direction. A rotation direction centered around the Z direction is defined as a θ direction.

As shown in FIG. 1, a substrate processing apparatus 500 includes an indexer block 9, an anti-reflection film processing block 10, a resist film processing block 11, a development processing block 12, a resist cover film processing block 13, a resist cover film removal block 14, and an interface block 15. An exposure device 16 is arranged adjacent to the interface block 15. The exposure device 16 subjects a substrate W to exposure processing by means of a liquid immersion method.

Each of the indexer block 9, the anti-reflection film processing block 10, the resist film processing block 11, the development processing block 12, the resist cover film processing block 13, the resist cover film removal block 14, and the interface block 15 will be hereafter referred to as a processing block.

The indexer block 9 includes a main controller (controller) 30 for controlling the operation of each of the processing blocks, a plurality of carrier platforms 40, and an indexer robot IR. The indexer robot IR has a hand IRH provided for receiving and transferring the substrates W.

The anti-reflection film processing block 10 includes thermal processing groups 100 and 101 for anti-reflection film, a coating processing group 50 for anti-reflection film, and a first central robot CR1. The coating processing group 50 is opposed to the thermal processing groups 100 and 101 with the first central robot CR1 held therebetween. The first central robot CR1 has hands CRH1 and CRH2 provided one above the other for receiving and transferring the substrates W.

A partition wall 17 is provided between the indexer block 9 and the anti-reflection film processing block 10 for shielding an atmosphere. The partition wall 17 has substrate platforms PASS1 and PASS2 provided in close proximity one above the other for receiving and transferring the substrates W between the indexer block 9 and the anti-reflection film processing block 10. The upper substrate platform PASS1 is used in transporting the substrates W from the indexer block 9 to the anti-reflection film processing block 10, and the lower substrate platform PASS2 is used in transporting the substrates W from the anti-reflection film processing block 10 to the indexer block 9.

Each of the substrate platforms PASS1 and PASS2 is provided with an optical sensor (not shown) for detecting the presence or absence of the substrate W. This allows determination whether or not the substrate W is placed on the substrate platform PASS1 or PASS2. Furthermore, each of the substrate platforms PASS1 and PASS2 has a plurality of support pins secured thereto. Note that each of substrate platforms PASS3 to PASS13 described later is similarly provided with an optical sensor and support pins.

The resist film processing block 11 includes thermal processing groups 110 and 111 for resist film, a coating processing group 60 for resist film, and a second central robot CR2. The coating processing group 60 is opposed to the thermal processing groups 110 and 111 with the second central robot CR2 held therebetween. The second central robot CR2 has hands CRH3 and CRH4 provided one above the other for receiving and transferring the substrates W.

A partition wall 18 is provided between the anti-reflection film processing block 10 and the resist film processing block 11 for shielding an atmosphere. The partition wall 18 has substrate platforms PASS3 and PASS4 provided in close proximity one above the other for receiving and transferring the substrates W between the anti-reflection film processing block 10 and the resist film processing block 11. The upper substrate platform PASS3 is used in transporting the substrates W from the anti-reflection film processing block 10 to the resist film processing block 11, and the lower substrate platform PASS4 is used in transporting the substrates W from the resist film processing block 11 to the anti-reflection film processing block 10.

The development processing block 12 includes thermal processing groups 120 and 121 for development, a development processing group 70, and a third central robot CR3. The development processing group 70 is opposed to the thermal processing groups 120 and 121 with the third central robot CR3 held therebetween. The third central robot CR3 has hands CRH5 and CRH6 provided one above the other for receiving and transferring the substrates W.

A partition wall 19 is provided between the resist film processing block 11 and the development processing block 12 for shielding an atmosphere. The partition wall 19 has substrate platforms PASS5 and PASS6 provided in close proximity one above the other for receiving and transferring the substrates W between the resist film processing block 11 and the development processing block 12. The upper substrate platform PASS5 is used in transporting the substrates W from the resist film processing block 11 to the development processing block 12, and the lower substrate platform PASS6 is used in transporting the substrates W from the development processing block 12 to the resist film processing block 11.

The resist cover film processing block 13 includes thermal processing groups 130 and 131 for resist cover film, a coating processing group 80 for resist cover film, and a fourth central robot CR4. The coating processing group 80 is opposed to the thermal processing groups 130 and 131 with the fourth central robot CR4 held therebetween. The fourth central robot CR4 has hands CRH7 and CRH8 provided one above the other for receiving and transferring the substrates W.

A partition wall 20 is provided between the development processing block 12 and the resist cover film processing block 13 for shielding an atmosphere. The partition wall 20 has substrate platforms PASS7 and PASS8 provided in close proximity one above the other for receiving and transferring the substrates W between the development processing block 12 and the resist cover film processing block 13. The upper substrate platform PASS7 is used in transporting the substrates W from the development processing block 12 to the resist cover film processing block 13, and the lower substrate platform PASS8 is used in transporting the substrates W from the resist cover film processing block 13 to the development processing block 12.

The resist cover film removal block 14 includes thermal processing groups 140 and 141 for post-exposure bake, a removal processing group 90 for resist cover film, and a fifth central robot CR5. The thermal processing group 141 is adjacent to the interface block 15, and includes substrate platforms PASS11 and PASS12, as described later. The removal processing group 90 is opposed to the thermal processing groups 140 and 141 with the fifth central robot CR5 held therebetween. The fifth central robot CR5 has hands CRH9 and CRH10 provided one above the other for receiving and transferring the substrates W.

A partition wall 21 is provided between the resist cover film processing block 13 and the resist cover film removal block 14 for shielding an atmosphere. The partition wall 21 has substrate platforms PASS9 and PASS10 provided in close proximity one above the other for receiving and transferring the substrates W between the resist cover film processing block 13 and the resist cover film removal block 14. The upper substrate platform PASS9 is used in transporting the substrates W from the resist cover film processing block 13 to the resist cover film removal block 14, and the lower substrate platform PASS10 is used in transporting the substrates W from the resist cover film removal block 14 to the resist cover film processing block 13.

The interface block 15 includes a reversing unit RT, cleaning processing units SD1, a sixth central robot CR6, an edge exposure unit EEW, a sending buffer unit SBF, a return buffer unit RBF, placement/cooling units PASS-CP (hereinafter abbreviated as P-CP), a substrate platform PASS13, an interface transport mechanism IFR, and drying processing units SD2. The cleaning processing unit SD1 subjects the substrate W before exposure processing to cleaning processing, and the drying processing unit SD2 subjects the substrate W after exposure processing to drying processing.

The sixth central robot CR6 has hands CRH11 and CRH12 (see FIG. 4) provided one above the other for receiving and transferring the substrates W, and the interface transport mechanism IFR has hands H1 and H2 (see FIG. 4) provided one above the other for receiving and transferring the substrates W. The details of the interface block 15 will be described later.

In the substrate processing apparatus 500 according to the present embodiment, the indexer block 9, the anti-reflection film processing block 10, the resist film processing block 11, the development processing block 12, the resist cover film processing block 13, the resist cover film removal block 14, and the interface block 15 are provided side by side in this order in the Y direction.

Figure 2:
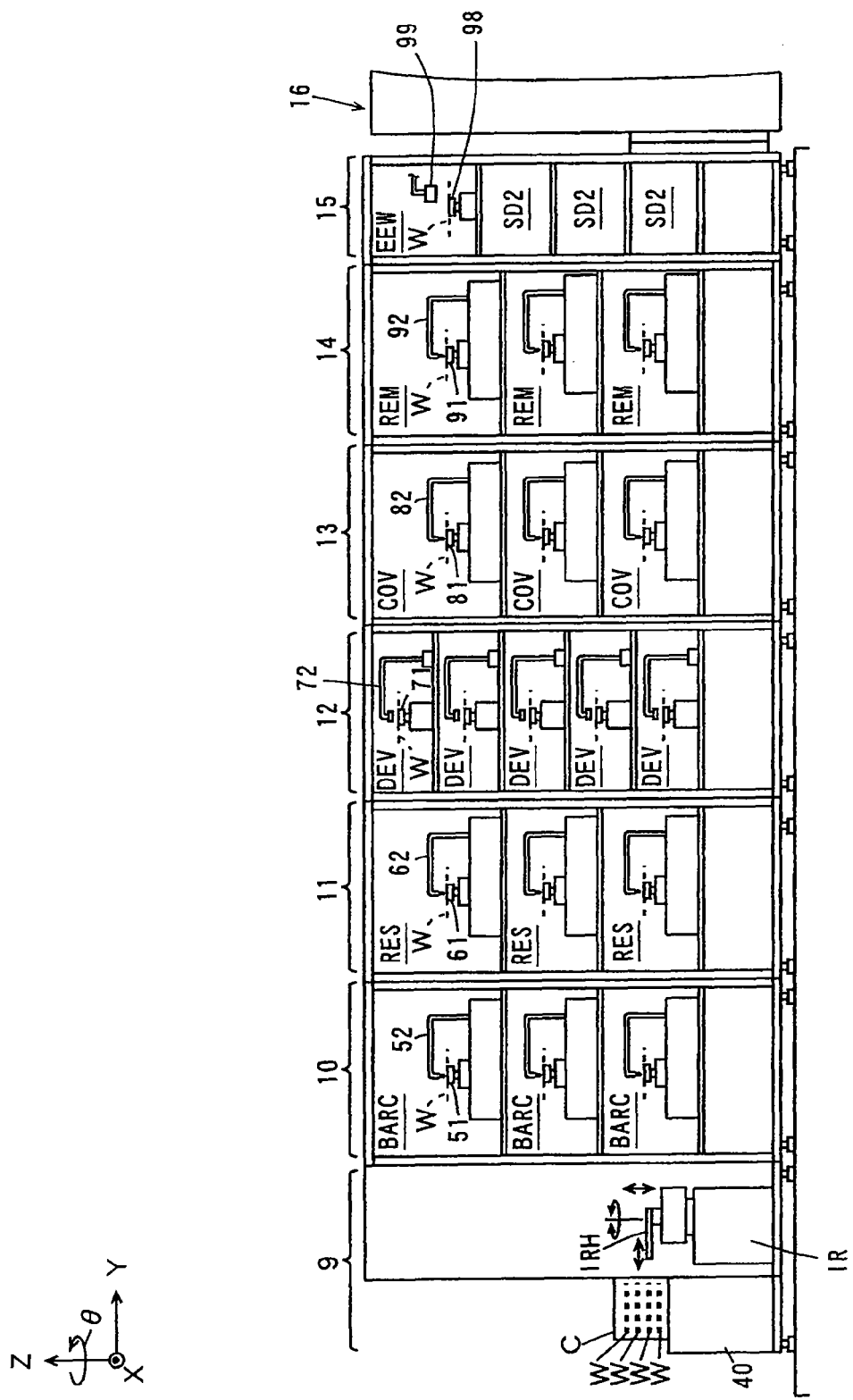
FIG. 2 is a schematic side view of the substrate processing apparatus shown in FIG. 1 as viewed from the +X direction.
Figure 3:
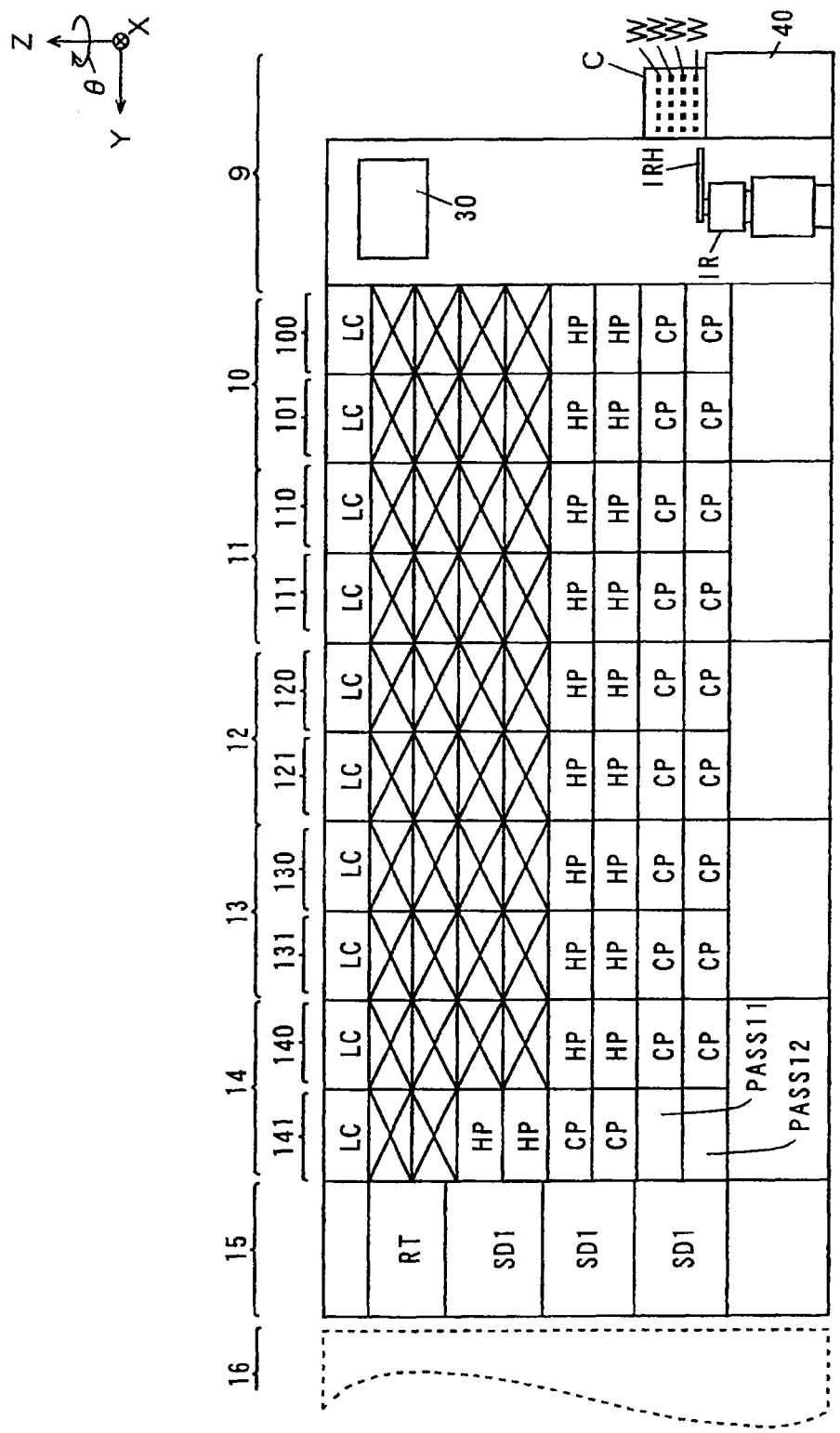
FIG. 3 is a schematic side view of the substrate processing apparatus shown in FIG. 1 as viewed from the −X direction.

FIG. 2 is a schematic side view of the substrate processing apparatus 500 shown in FIG. 1 as viewed from the +X direction, and FIG. 3 is a schematic side view of the substrate processing apparatus 500 shown in FIG. 1 as viewed from the −X direction. FIG. 2 mainly shows the configuration on the +X side of the substrate processing apparatus 500, and FIG. 3 mainly shows the configuration on the −X side of the substrate processing apparatus 500.

Description is first made of the configuration on the +X side of the substrate processing apparatus 500 using FIG. 2. As shown in FIG. 2, the coating processing group 50 in the anti-reflection film processing block 10 (see FIG. 1) has a vertical stack of three coating units BARC. Each of the coating units BARC includes a spin chuck 51 for rotating the substrate W with the substrate W held in a horizontal attitude by suction, and a supply nozzle 52 for supplying a coating liquid for an anti-reflection film to the substrate W held on the spin chuck 51.

The coating processing group 60 in the resist film processing block 11 (see FIG. 1) has a vertical stack of three coating units RES. Each of the coating units RES includes a spin chuck 61 for rotating the substrate W with the substrate W held in a horizontal attitude by suction, and a supply nozzle 62 for supplying a coating liquid for a resist film to the substrate W held on the spin chuck 61.

The development processing group 70 in the development processing block 12 has a vertical stack of five development processing units DEV. Each of the development processing units DEV includes a spin chuck 71 for rotating the substrate W with the substrate W held in a horizontal attitude by suction, and a supply nozzle 72 for supplying a development liquid to the substrate W held on the spin chuck 71.

The coating processing group 80 in the resist cover film processing block 13 has a vertical stack of three coating units COV. Each of the coating units COV includes a spin chuck 81 for rotating the substrate W with the substrate W held in a horizontal attitude by suction, and a supply nozzle 82 for supplying a coating liquid for a resist cover film to the substrate W held on the spin chuck 81. Materials having a low affinity for resists and water (materials having low reactivity to resists and water) can be used as the coating liquid for the resist cover film. An example of the coating liquid is fluororesin. Each of the coating units COV forms the resist cover film on the resist film formed on the substrate W by applying the coating liquid onto the substrate W while rotating the substrate W.

The removal processing group 90 in the resist cover film removal block 14 has a vertical stack of three removal units REM. Each of the removal units REM includes a spin chuck 91 for rotating the substrate W with the substrate W held in a horizontal attitude by suction, and a supply nozzle 92 for supplying a stripping liquid (e.g. fluororesin) onto the substrate W held on the spin chuck 91. Each of the removal units REM removes the resist cover film formed on the substrate W by applying the stripping liquid onto the substrate W while rotating the substrate W.

Note that a method of removing the resist cover films in the removal units REM is not limited to the above-mentioned examples. For example, the resist cover film may be removed by supplying the stripping liquid onto the substrate W while moving a slit nozzle above the substrate W.

The interface block 15 has a vertical stack of an edge exposure unit EEW and three drying processing units SD2 on the +X side. The edge exposure unit EEW includes a spin chuck 98 for rotating the substrate W with the substrate held in a horizontal attitude by suction, and a light irradiator 99 for exposing a peripheral portion of the substrate W held on the spin chuck 98.

Description is now made of the configuration on the −X side of the substrate processing apparatus 500 using FIG. 3. As shown in FIG. 3, each of the thermal processing groups 100 and 101 in the anti-reflection film processing block 10 has a stack of two heating units (hot plates) HP and two cooling units (cooling plates) CP. Each of the thermal processing groups 100 and 101 has a local controller LC for controlling the respective temperatures of the heating units HP and the cooling units CP arranged in its uppermost part.

Each of the thermal processing groups 110 and 111 in the resist film processing block 11 has a stack of two heating units HP and two cooling units CP. Each of the thermal processing groups 110 and 111 also has a local controller LC for controlling the respective temperatures of the heating units HP and the cooling units CP arranged in its uppermost part.

Each of the thermal processing groups 120 and 121 in the development processing block 12 has a stack of two heating units HP and two cooling units CP. Each of the thermal processing groups 120 and 121 also has a local controller LC for controlling the respective temperatures of the heating units HP and the cooling units CP arranged in its uppermost part.

Each of the thermal processing groups 130 and 131 in the resist cover film processing block 13 has a stack of two heating units HP and two cooling units CP. Each of the thermal processing groups 130 and 131 also has a local controller LC for controlling the respective temperatures of the heating units HP and the cooling units CP arranged in its uppermost part.

In the resist cover film removal block 14, the thermal processing group 140 has a vertical stack of two heating units HP and two cooling units CP, and the thermal processing group 141 has a vertical stack of two heating units HP, two cooling units CP, and substrate platforms PASS11 and PASS12. Each of the thermal processing groups 140 and 141 has a local controller LC for controlling the respective temperatures of the heating units HP and the cooling units CP arranged in its uppermost part.

Figure 4:
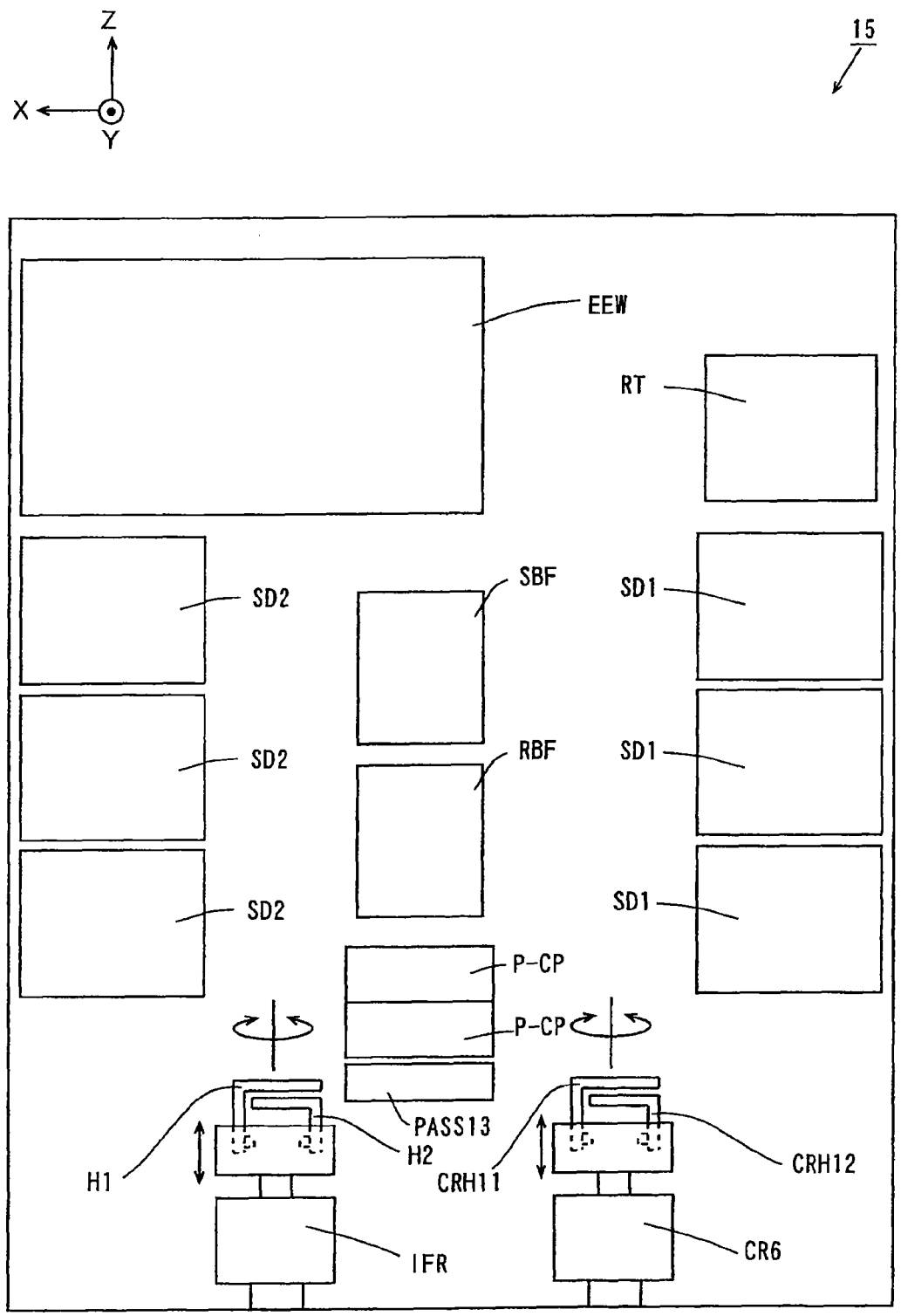
FIG. 4 is a schematic side view of an interface block as viewed from the +Y side.

The interface block 15 will be then described in detail using FIG. 4.

FIG. 4 is a schematic side view of the interface block 15 as viewed from the +Y side. As shown in FIG. 4, the interface block 15 has a stack of a reversing unit RT and three cleaning processing units SD1 on the −X side. The interface block 15 has an edge exposure unit EEW arranged on the +X side in its upper part.

The interface block 15 has a vertical stack of a sending buffer unit SBE, a return buffer unit RBF, two placement/cooling units P-CP, and a substrate platform PASS13 at its substantially central portion below the edge exposure unit EEW. The interface block 15 has a vertical stack of three drying processing units SD2 arranged on the +X side below the edge exposure unit EEW.

A sixth central robot CR6 and an interface transport mechanism IFR are provided in a lower part of the interface block 15. The sixth central robot CR6 is provided so as to be vertically movable and rotatable in an area among the reversing unit RT, the cleaning processing units SD1, the edge exposure unit EEW, the sending buffer unit SBF, the return buffer unit RBF, the placement/cooling units P-CP, and the substrate platform PASS13. The interface transport mechanism IFR is provided so as to be vertically movable and rotatable in an area among the placement/cooling units P-CP, the substrate platform PASS13, and the drying processing units SD2.

(2) Operations of Substrate Processing Apparatus

The operations of the substrate processing apparatus 500 according to the present embodiment will be then described with reference to FIGS. 1 to 4.

(2-1) Operations of Indexer Block to Resist Cover Film Removal Block

First, the operations of the indexer block 9 to the resist cover film removal block 14 will be briefly described.

Carriers C that store a plurality of substrates W in multiple stages are respectively carried onto the carrier platforms 40 in the indexer block 9. The indexer robot IR takes out the unprocessed substrate W that is stored in the carrier C using the hand IRH. Thereafter, the indexer robot IR rotates in the ±θ direction while moving in the ±X direction, to place the unprocessed substrate W on the substrate platform PASS1.

Although FOUPs (Front Opening Unified Pods) are adopted as the carriers C in the present embodiment, the present invention is not limited to the same. For example, SMIF (Standard Mechanical Inter Face) pods, OCs (Open Cassettes) that expose the stored substrates W to outside air, and so on may be used.

Furthermore, although linear-type transport robots that move their hands forward or backward by linearly sliding them to the substrate W are respectively used as the indexer robot IR, the first to sixth central robots CR1 to CR6, and the interface transport mechanism IFR, the present invention is not limited to the same. For example, multi-joint type transport robots that linearly move their hands forward and backward by moving their joints may be used.

The unprocessed substrate W placed on the substrate platform PASS1 is received by the first central robot CR1 in the anti-reflection film processing block 10. The first central robot CR1 carries the substrate W into the thermal processing group 100 or 101.

Thereafter, the first central robot CR1 takes out the thermally processed substrate W from the thermal processing group 100 or 101 and carries the substrate W into the coating processing group 50. In the coating processing group 50, the coating unit BARC forms a coating of an anti-reflection film on the substrate W in order to reduce standing waves and halation generated during the exposure processing.

The first central robot CR1 then takes out the substrate W after the coating processing from the coating processing group 50 and carries the substrate W into the thermal processing group 100 or 101. Thereafter, the first central robot CR1 takes out the thermally processed substrate W from the thermal processing group 100 or 101 and places the substrate W on the substrate platform PASS3.

The substrate W placed on the substrate platform PASS3 is received by the second central robot CR2 in the resist film processing block 11. The second central robot CR2 carries the substrate W into the thermal processing group 110 or 110.

Thereafter, the second central robot CR2 takes out the thermally processed substrate W from the thermal processing group 110 or 111 and carries the substrate W into the coating processing group 60. In the coating processing group 60, the coating unit RES forms a coating of a resist film on the substrate W that has been coated with the anti-reflection film.

The second central robot CR2 then takes out the substrate W after the coating processing from the coating processing group 60 and carries the substrate W into the thermal processing group 110 or 111. Thereafter, the second central robot CR2 takes out the thermally processed substrate W from the thermal processing group 110 or 111 and places the substrate W on the substrate platform PASS5.

The substrate W placed on the substrate platform PASS5 is received by the third central robot CR3 in the development processing block 12. The third central robot CR3 places the substrate W on the substrate platform PASS7.

The substrate W placed on the substrate platform PASS7 is received by the fourth central robot CR4 in the resist cover film processing block 13. The fourth central robot CR4 carries the substrate W into the coating processing group 80. In the coating processing group 80, the coating unit COV forms a coating of a resist cover film on the substrate W that has been coated with the resist film.

The fourth central robot CR4 then takes out the substrate W after the coating processing from the coating processing group 80 and carries the substrate W into the thermal processing group 130 or 131. Thereafter, the fourth central robot CR4 takes out the thermally processed substrate W from the thermal processing group 130 or 131 and places the substrate W on the substrate platform PASS9.

The substrate W placed on the substrate platform PASS9 is received by the fifth central robot CR5 in the resist cover film removal block 14. The fifth central robot CR5 places the substrate W on the substrate platform PASS11.

The substrate W placed on the substrate platform PASS11 is received by the sixth central robot CR6 in the interface block 15, and is subjected to predetermined processing in the interface block 15 and the exposure device 16, as described later. After the substrate W is subjected to the predetermined processing in the interface block 15 and the exposure device 16, the sixth central robot CR6 carries the substrate W into the thermal processing group 141 in the resist cover film removal block 14.

In the thermal processing group 141, the substrate W is subjected to post-exposure bake (PEB). Thereafter, the sixth central robot CR6 takes out the substrate W from the thermal processing group 141 and places the substrate W on the substrate platform PASS12.

Although the substrate W is subjected to the post-exposure bake in the thermal processing group 141 in the present embodiment, the substrate W may be subjected to post-exposure bake in the thermal processing group 140.

The substrate W placed on the substrate platform PASS12 is received by the fifth central robot CR5 in the resist cover film removal block 14. The fifth central robot CR5 carries the substrate W into the removal processing group 90. In the removal processing group 90, the resist cover film is removed.

The fifth central robot CR5 then takes out the processed substrate W from the removal processing group 90 and places the substrate W on the substrate platform PASS10.

The substrate W placed on the substrate platform PASS11 is placed on the substrate platform PASS8 by the fourth central robot CR4 in the resist cover film processing block 13.

The substrate W placed on the substrate platform PASS8 is received by the third central robot CR3 in the development processing block 12. The third central robot CR3 carries the substrate W into the development processing group 70. In the development processing group 70, the exposed substrate W is subjected to development processing.

The third central robot CR3 then takes out the substrate W after the development processing from the development processing group 70 and carries the substrate W into the thermal processing group 120 or 121. Thereafter, the third central robot CR3 takes out the thermally processed substrate W from the thermal processing group 120 or 121 and places the substrate W on the substrate platform PASS6.

The substrate W placed on the substrate platform PASS6 is placed on the substrate platform PASS4 by the second central robot CR2 in the resist film processing block 11. The substrate W placed on the substrate platform PASS4 is placed on the substrate platform PASS2 by the first central robot CR1 in the anti-reflection film processing block 10.

The substrate W placed on the substrate platform PASS2 is stored in the carrier C by the indexer robot IR in the indexer block 9. Each processing for the substrate W in the substrate processing apparatus 500 is thus terminated.

(2-2) Operation of Interface Block

The operation of the interface block 15 will be then described.

As described in the foregoing, the substrate W carried into the indexer block 9 is subjected to predetermined processing, and is then placed on the substrate platform PASS11 in the resist cover film removal block 14 (FIG. 1).

The substrate W placed on the substrate platform PASS11 is received by the sixth central robot CR6 in the interface block 15. The sixth central robot CR6 carries the substrate W into the edge exposure unit EEW (FIG. 4). In the edge exposure unit EEW, a peripheral portion of the substrate W is subjected to exposure processing.

The sixth central robot CR6 then takes out the substrate W after the exposure processing from the edge exposure unit EEW and carries the substrate W into any one of the cleaning processing units SD1. In the cleaning processing unit SD1, the substrate W before the exposure processing is subjected to cleaning processing, as described above.

Here, a time period for the exposure processing by the exposure device 16 is ordinarily longer than those for other processing and transporting processes. As a result, the exposure device 16 cannot accept the subsequent substrates W in many cases. In this case, the substrate W is temporarily stored in the sending buffer unit SBF (FIG. 4). In the present embodiment, the sixth central robot CR6 takes out the substrate W after the cleaning processing from the cleaning processing unit SD1 and transports the substrate W to the sending buffer unit SBF.

The sixth central robot CR6 then takes out the substrate W stored in the sending buffer unit SBF and carries the substrate W into the placement/cooling unit P-CP. The substrate W carried into the placement/cooling unit P-CP is kept at the same temperature as that in the exposure device 16 (for example, 23° C.).

Note that in a case where the exposure device 16 has a sufficient processing speed, the substrate W need not be stored in the sending buffer unit SBF but may be transported to the placement/cooling unit P-CP from the cleaning processing unit SD1.

The substrate W kept at the above-mentioned predetermined temperature in the placement/cooling unit P-CP is then received with the upper hand H1 of the interface transport mechanism IFR (FIG. 4) and carried into a substrate inlet 16a in the exposure device 16 (FIG. 1).

The substrate W that has been subjected to the exposure processing in the exposure device 16 is carried out of a substrate outlet 16b (FIG. 1) with the lower hand H2 of the interface transport mechanism IFR (FIG. 4). The interface transport mechanism IFR carries the substrate W into any one of the drying processing units SD2 with the hand H2. In the drying processing unit SD2, the substrate W after the exposure processing is subjected to drying processing, as described above. Specifically, the substrate W after the exposure processing, for example, is kept horizontal, and a rinse liquid such as pure water is held on the substrate. The substrate W is rotated at high speed while inert gas is sprayed toward the center of the substrate W. This causes a liquid that adheres on the substrate W to move outward from the substrate W integrally with the rinse liquid. As a result, the liquid on the substrate W is removed, to dry the substrate W.

The substrate W that has been subjected to the drying processing in the drying processing unit SD2 is taken out with the hand H1 of the interface transport mechanism IFR (FIG. 4). The interface transport mechanism IFR places the substrate W on the substrate platform PASS13 with the hand H1.

The substrate W placed on the substrate platform PASS13 is received by the sixth central robot CR6. The sixth central robot CR6 transports the substrate W to the thermal processing group 141 in the resist cover film removal block 14 (FIG. 1).

Note that when the resist cover film removal block 14 cannot temporarily receive the substrate W due to a failure or the like in the removal unit REM (FIG. 2), the substrate W after the exposure processing can be temporarily stored in the return buffer unit RBF.

(3) As to Cleaning Processing Unit

Figure 5:
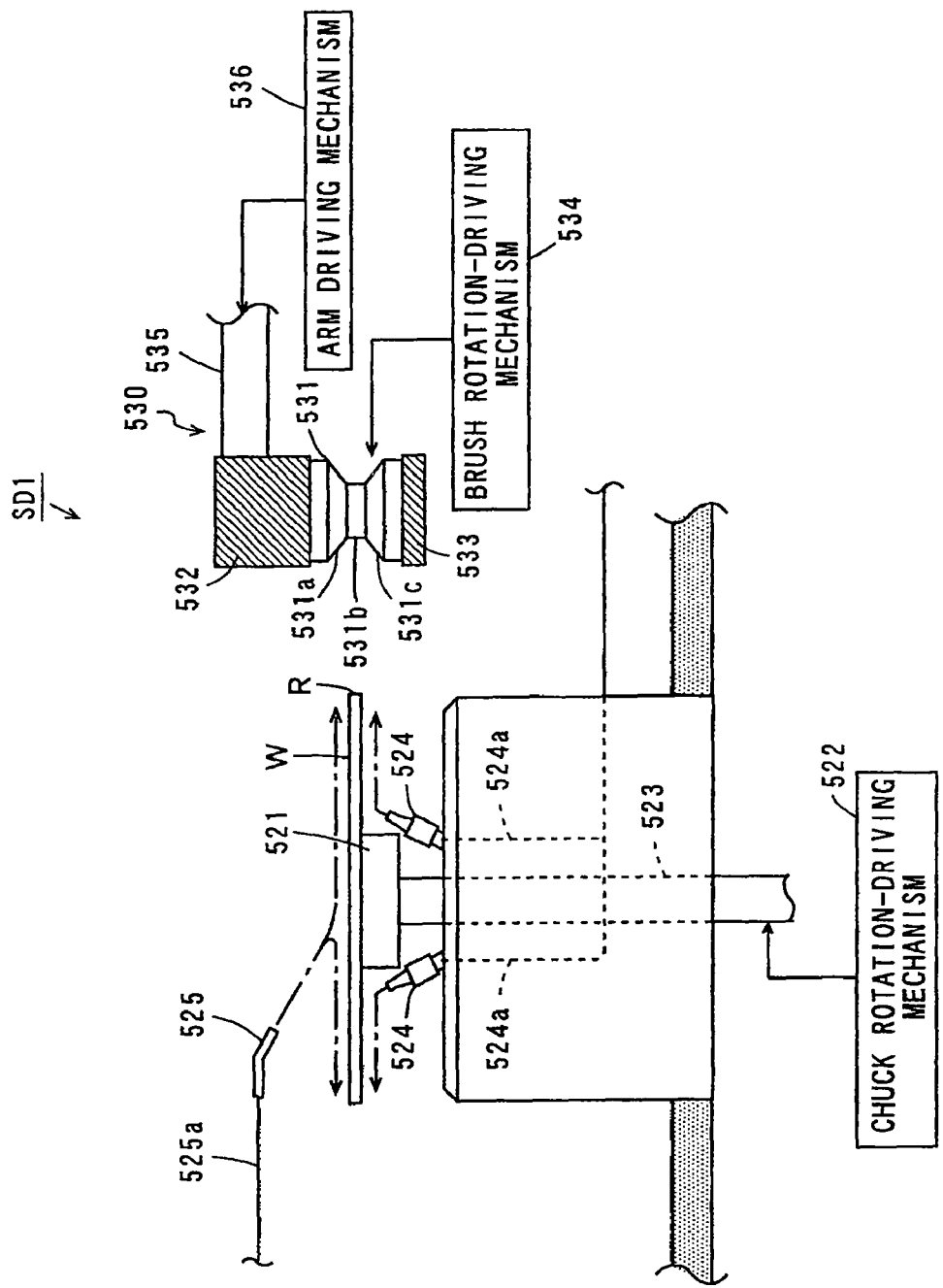
FIG. 5 is a diagram for explaining the configuration of a cleaning processing unit.

The details of the cleaning processing unit SD1 will be then described. FIG. 5 is a diagram for explaining the configuration of the cleaning processing unit SD1. As shown in FIG. 5, the cleaning processing unit SD1 includes a spin chuck 521 for keeping the substrate W horizontal while rotating a substrate W around its vertical axis passing through the center of the substrate W.

The spin chuck 521 is secured to an upper end of a rotating shaft 523 that is rotated by a chuck rotation-driving mechanism 523. Furthermore, a suction path (not shown) is formed in the spin chuck 521. By evacuating the suction path with the substrate W placed on the spin chuck 521 to adsorb a lower surface of the substrate W to the spin chuck 521 under vacuum, the substrate W can held in a horizontal attitude.

A plurality of (two in this example) lower surface nozzles 524 are directed outwardly upward in the vicinity of the spin chuck 521. Furthermore, an upper surface nozzle 525 is directed obliquely downward above the spin chuck 521. A cleaning liquid supply pipe 524a is connected to each of the lower surface nozzles 524, and a cleaning liquid supply pipe 525a is connected to the upper surface nozzle 525. A cleaning liquid is supplied to the lower surface nozzle 524 and the upper surface nozzle 525, respectively, through the cleaning liquid supply pipes 524a and 525a. In the present embodiment, pure water is used as the cleaning liquid.

When the substrate W is subjected to cleaning processing, the substrate W is rotated with the substrate W held in the spin chuck 521. The cleaning liquid is supplied toward the lower surface of the substrate W to be rotated from the lower surface nozzle 524. Furthermore, the cleaning liquid is supplied toward an upper surface of the substrate W to be rotated from the upper surface nozzle 525. The cleaning liquids respectively discharged from the lower surface nozzle 524 and the upper surface nozzle 525 expand outward by a centrifugal force. This causes respective peripheral regions of a top surface and a back surface of the substrate W to be cleaned.

A bevel cleaner 530 is arranged outside the spin chuck 521. The bevel cleaner 530 includes a cleaning brush 531. The cleaning brush 531 is held so as to be rotatable around its vertical axis by holding members 532 and 533, and is driven to rotate by a brush rotation-driving mechanism 534.

An arm 535 is connected to the holding member 532. An arm driving mechanism 536 moves the arm 535 in the vertical direction and the horizontal direction. As the arm driving mechanism 536 moves the arm 535, the cleaning brush 531 moves in the vertical direction and the horizontal direction.

The cleaning brush 531 has a shape that is rotationally-symmetric to the vertical axis, and has an upper bevel cleaning surface 531a, an end surface cleaning surface 531b, and a lower bevel cleaning surface 531c. The end surface cleaning surface 531b is a cylindrical surface having its axis in the vertical direction. The upper bevel cleaning surface 531a extends, inclined outwardly upward from an upper end of the end surface cleaning surface 531b, and the lower bevel cleaning surface 531c extends, inclined outwardly downward from a lower end of the end surface cleaning surface 531b.

When the substrate W is subjected to cleaning processing, the cleaning brush 531 in the bevel cleaner 530 cleans a bevel portion R of the substrate W.

Figure 6:
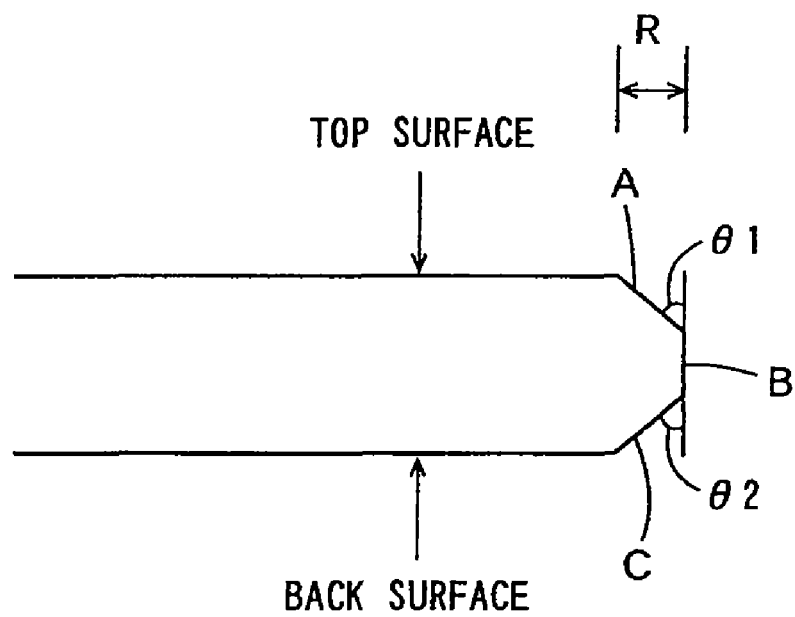
FIG. 6 is a diagram showing the details of a bevel portion of a substrate.

Description is herein made of the bevel portion R of the substrate W. FIG. 6 is a diagram showing the details of the bevel portion R of the substrate W. As shown in FIG. 6, the bevel portion R includes an upper bevel region A inclined so as to continuously connect with a flat top surface of the substrate W, a lower bevel region C inclined so as to continuously connect with a flat back surface of the substrate W, and an end surface region B. Note that the top surface of the substrate W refers to a surface, on which various patterns such as a circuit pattern are formed, of the substrate W, and the back surface of the substrate W refers to a surface, on the opposite side thereof, of the substrate W.

An angle of inclination θ1 of the upper bevel region A and an angle of inclination θ2 of the lower bevel region C to a vertical plane are approximately equal to each other. Respective angles of inclination of the upper bevel cleaning surface 531a and the lower bevel cleaning surface 531c of the cleaning brush 531 shown in FIG. 5 to the vertical plane are respectively made approximately equal to the angles of inclination θ1 and θ2 of the upper bevel region A and the lower bevel region C in the substrate W.

When the substrate W is subjected to the cleaning processing, the cleaning brush 531 shown in FIG. 5 rotates by the brush rotation-driving mechanism 534 while moving toward the bevel portion R of the substrate W by the arm driving mechanism 536. Furthermore, the cleaning brush 531 moves in the vertical direction such that the upper bevel cleaning surface 531a, the end surface cleaning surface 531b, and the lower bevel cleaning surface 531c of the cleaning brush 531 respectively come into contact with the upper bevel region A, the end surface region B, and the lower bevel region C (FIG. 6) in the bevel portion R of the substrate W.

Note that the cleaning liquids respectively discharged from the lower surface nozzle 524 and the upper surface nozzle 525 are introduced into the bevel portion R along the back surface and the top surface of the substrate W by a centrifugal force caused by the rotation of the substrate W. That is, the cleaning liquid is supplied to a contact portion between the cleaning brush 531 and the bevel portion R of the substrate W.

FIG. 7 is a plan view showing the respective rotation directions of the substrate W and the cleaning brush 531, and FIGS. 8(a) to 8(c) are diagrams showing a contact state between the substrate W and the cleaning brush 531.

As shown in FIG. 7, the cleaning brush 531 and the substrate W are rotated in the same direction. In this case, the relative rotational speed between the cleaning brush 531 and the substrate W is increased in the contact portion between the cleaning brush 531 and the substrate W. This causes the bevel portion R of the substrate W to be efficiently cleaned.

As shown in FIG. 8(a), the upper bevel cleaning surface 531a of the cleaning brush 531 comes into contact with the upper bevel region A in the substrate W, so that the upper bevel region A in the substrate W is cleaned. As described above, the angle of inclination of the upper bevel region A in the substrate W and the angle of inclination of the upper bevel cleaning surface 531a of the cleaning brush 531 are approximately equal to each other. Therefore, the upper bevel cleaning surface 531a of the cleaning brush 531 can be brought into contact with the whole area of the upper bevel region A in the substrate W. This allows the whole area of the upper bevel region A to be reliably cleaned.

Furthermore, as shown in FIG. 8(b), the lower bevel cleaning surface 531c of the cleaning brush 531 comes into contact with the lower bevel region C in the substrate W, so that the lower bevel region C in the substrate W is cleaned. As described above, the angle of inclination of the lower bevel region C in the substrate W and the angle of inclination of the lower bevel cleaning surface 531c of the cleaning brush 531 are approximately equal to each other. Therefore, the lower bevel cleaning surface 531c of the cleaning brush 531 can be brought into contact with the whole area of the lower bevel region C in the substrate W. Therefore, the whole area of the lower bevel region C can be reliably cleaned.

Furthermore, as shown in FIG. 8(c), the end surface cleaning surface 531b of the cleaning brush 531 is brought into contact with the end surface region B in the substrate W, so that the end surface region B in the substrate W is cleaned.

The whole area of the bevel portion R of the substrate W can be reliably cleaned by respectively bringing the upper bevel cleaning surface 531a, the end surface cleaning surface 531b, and the lower bevel cleaning surface 531c of the cleaning brush 531 into contact with the upper bevel region A, the end surface region B, and the lower bevel region C in the substrate W. This allows a contaminant that adheres to the bevel portion R of the substrate W to be reliably removed.

After the upper bevel region A, the end surface region B, and the lower bevel region C in the substrate W are cleaned, the cleaning brush 531 separates from the substrate W. Then, the rotational speed of the rotating shaft 553 (FIG. 5) rises, which causes the cleaning liquid that adheres to the substrate W to be scattered by a centrifugal force. This causes the substrate W to be dried. Note that an inert gas supply nozzle for spraying inert gas such as N2 (nitrogen) to the substrate W may be further provided in order to dry the substrate W efficiently and reliably.

(3-a) Another Example of Installation of the Cleaning Brush

Figure 9:
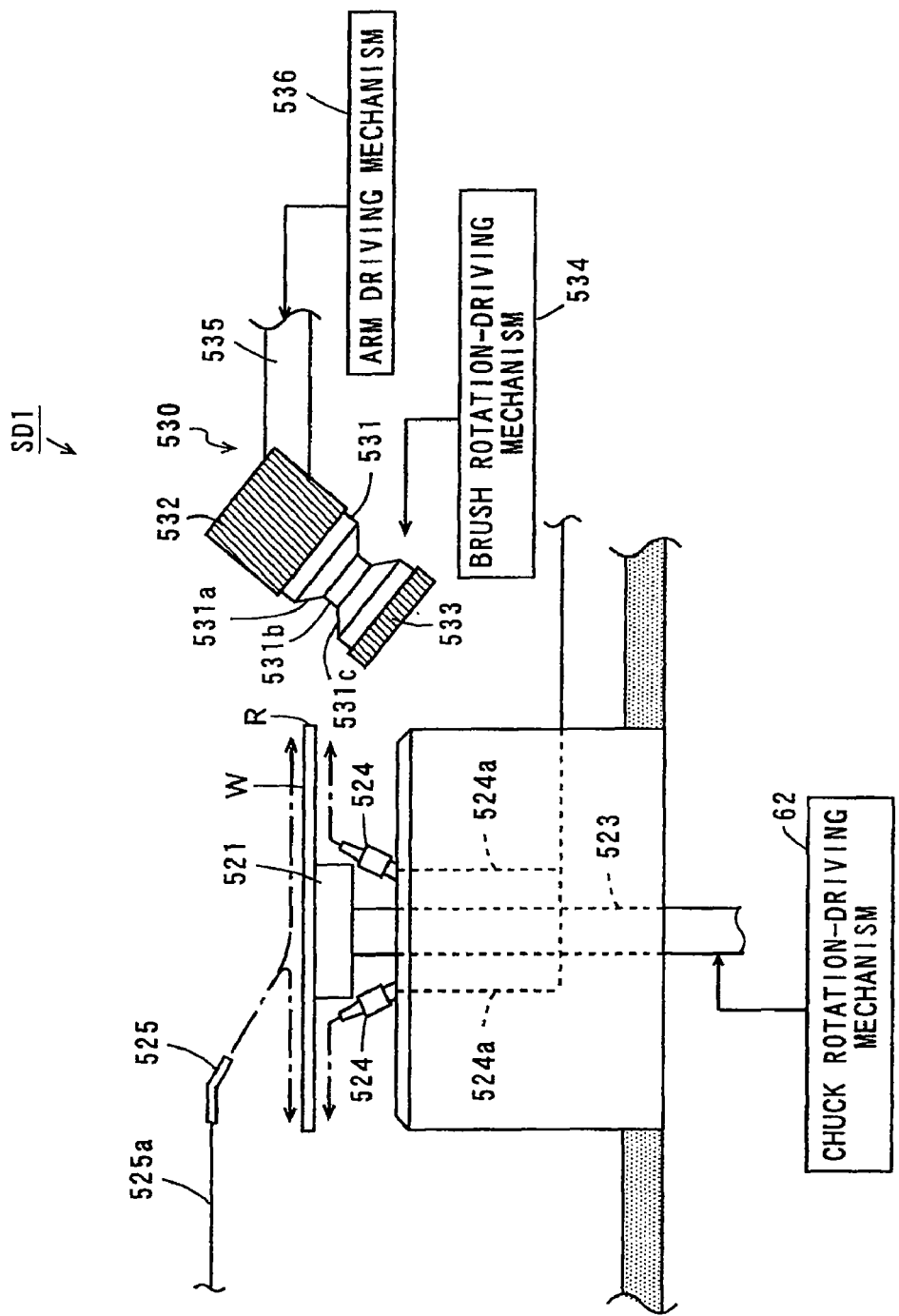
FIG. 9 is a diagram showing another example of installation of a cleaning blush.

FIG. 9 is a diagram showing another example of installation of the cleaning brush 531. In the cleaning processing unit SD1 shown in FIG. 9, the cleaning brush 531 is provided so as to be inclined to its vertical axis. The angle of inclination of the cleaning brush 531 is set such that the lower bevel cleaning surface 531c is parallel to a horizontal plane.

FIG. 10 is a diagram for explaining cleaning processing of the bevel portion R of the substrate W in the cleaning processing unit SD1 shown in FIG. 9. As shown in FIG. 10, in the cleaning processing unit SD1, the lower bevel cleaning surface 531c of the cleaning brush 531 can clean a peripheral region on the lower surface of the substrate W. This allows a contaminant that adheres to the peripheral region on the lower surface of the substrate W to be reliably removed.

The lower bevel region C in the substrate W can be cleaned by bringing the end surface cleaning surface 531b of the cleaning brush 531 into contact with the lower bevel region C in the substrate W. Furthermore, the end surface region B in the substrate W can be cleaned by bringing the upper bevel cleaning surface 531a of the cleaning brush 531 into contact with the end surface region B in the substrate W.

Figure 8:
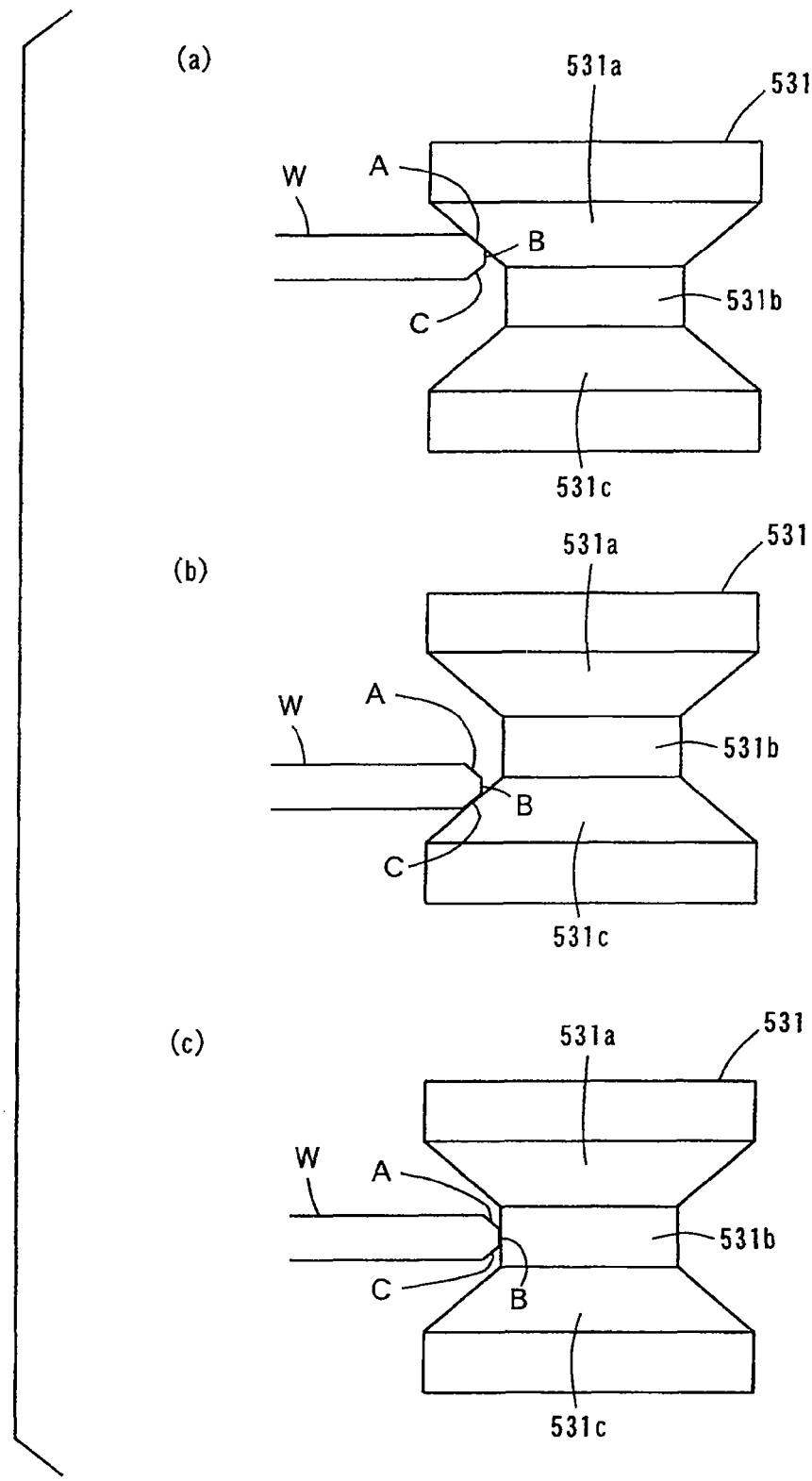
FIGS. 8(a) to 8(c) are diagrams showing a contact state between a substrate and a cleaning brush.

Note that the angle of inclination of the cleaning brush 531 may be made optionally controllable. In the case, the upper bevel region A, the end surface region B, and the lower bevel region C in the bevel portion R of the substrate W can be cleaned with the cleaning brush 531 in an upright attitude, as shown in FIG. 8. Furthermore, the peripheral region on the lower surface of the substrate W can be cleaned by inclining the cleaning brush 531 as shown in FIG. 10.

(3-b) Another Example of the Bevel Cleaner

Figure 11:
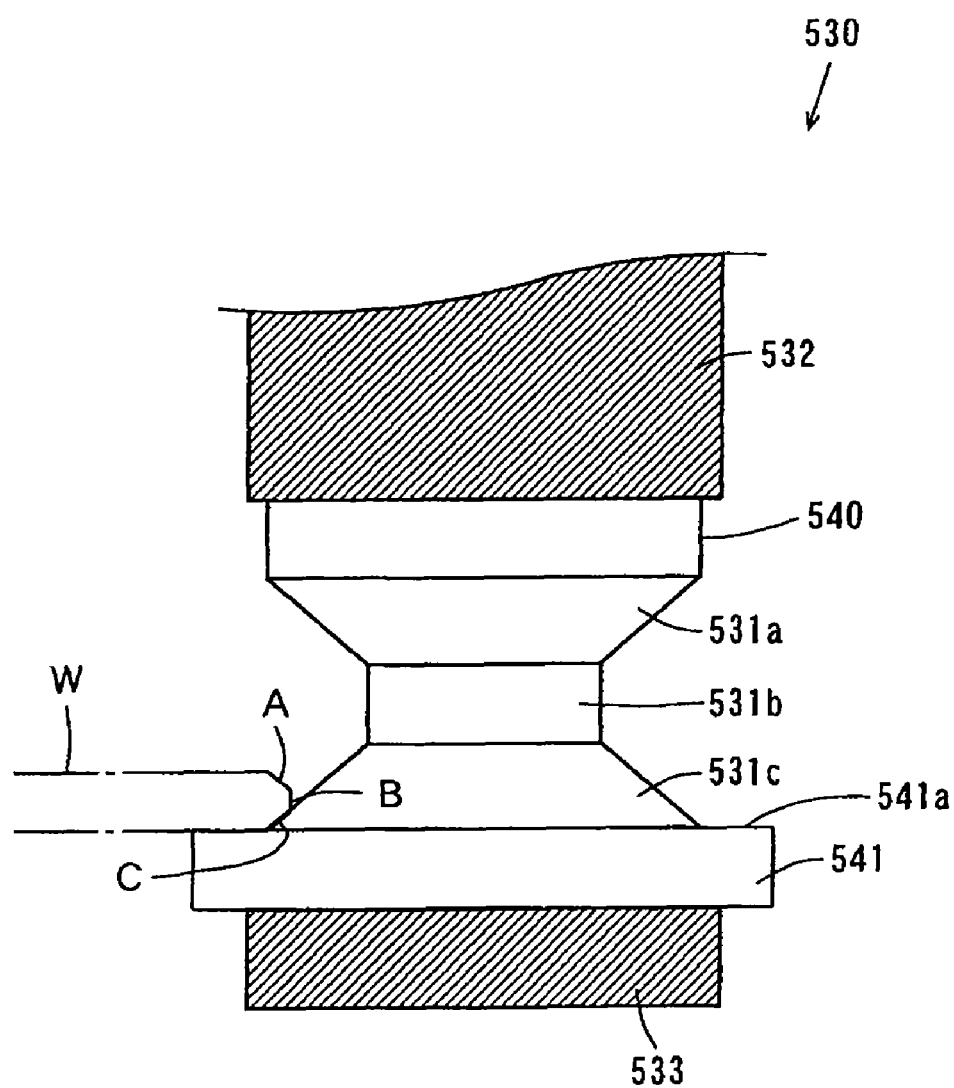
FIG. 11 is a diagram showing another example of a bevel cleaner.

FIG. 11 is a diagram showing another example of the bevel cleaner 530. A bevel cleaner 530 shown in FIG. 11 differs from the bevel cleaner 530 shown in FIG. 5 in that it includes a cleaning brush 540 in place of the cleaning brush 531.

The cleaning brush 540 differs from the cleaning brush 531 shown in FIG. 5 in the following points. A lower surface cleaner 541 is formed so as to project outward in a lower part of the cleaning brush 540. An upper surface 541*a* of the lower surface cleaner 541 (hereinafter referred to as a lower surface cleaning surface 541*a*) extends outward along a horizontal plane from a lower end of a lower bevel cleaning surface 531*c*.

When the cleaning brush 540 is used, a peripheral region on a back surface of a substrate W, in addition to an upper bevel region A, an end surface region B, and a lower bevel region C in the substrate W, can be cleaned by the lower surface cleaning surface 541*a*.

(3-c) Still Another Example of the Bevel Cleaner

Figure 12:
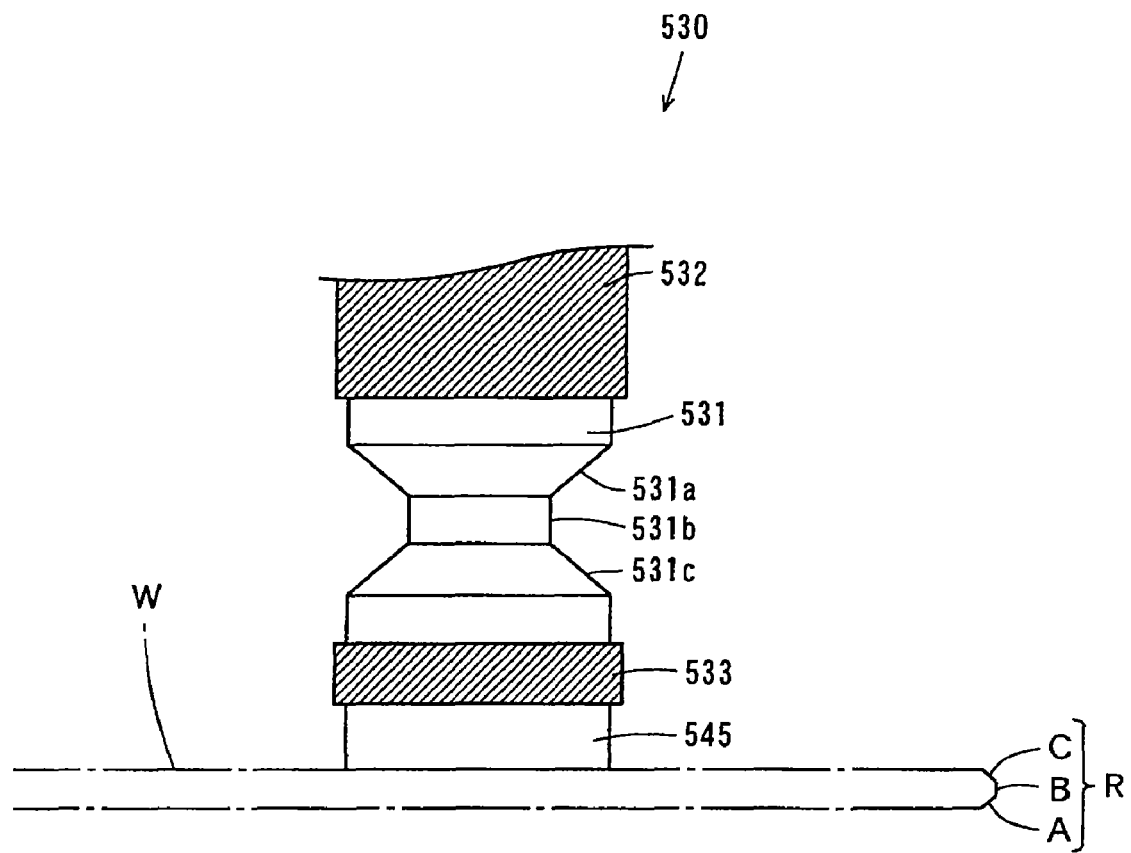
FIG. 12 is a diagram showing still another example of a bevel cleaner.

FIG. 12 is a diagram showing still another example of the bevel cleaner 530. In a bevel cleaner 530 shown in FIG. 12, a back surface cleaning brush 545 is attached to a lower surface of a holding member 533.

In the bevel cleaner 530, the whole area of a back surface of a substrate W, in addition to an upper bevel region A, an end surface region B, and a lower bevel region C in the substrate W, can be cleaned by the back surface cleaning brush 545. Specifically, the upper bevel region A, the end surface region B, and the lower bevel region C in the substrate W are first cleaned by a cleaning brush 531, as shown in FIG. 8. After the cleaning liquid that adheres to the substrate W is scattered to dry the substrate W, the substrate W is carried once out of the cleaning processing unit SD1 by the sixth central robot CR6 (FIG. 4).

Then, the substrate W is carried into the reversing unit RT (FIG. 4). In the reversing unit RT, a top surface and the back surface of the substrate W are reversed. That is, the back surface of the substrate W is directed upward. The substrate W is carried into the cleaning processing unit SD1 again. The substrate W carried into the cleaning processing unit SD1 again is held by the spin chuck 521 with the back surface thereof directed upward.

In the state, the substrate W is rotated while the cleaning liquid is supplied from the upper surface nozzle 525. The substrate W is scanned from its central portion to peripheral portion with the back surface cleaning brush 545 in the bevel cleaner 530 brought into contact with the back surface of the substrate W. Therefore, the back surface cleaning brush 545 cleans the whole area of the back surface of the substrate W, to more reliably remove a contaminant that adheres to the back surface of the substrate W.

Note that the back surface cleaning brush 545 may be driven to rotate integrally with the cleaning brush 531 by the brush rotation-driving mechanism 534. Although the back surface of the substrate W is cleaned after a bevel portion R of the substrate W is cleaned in this example, the bevel portion R of the substrate W may be cleaned after the back surface of the substrate W is cleaned.

When the bevel cleaner 530 shown in FIG. 12 is used, it is preferable that the spin chuck 521 of a vacuum suction type is replaced with a spin chuck that can rotate the substrate W by holding the bevel portion R of the substrate W in a plurality of holding pins and rotating each of the plurality of holding pins around its vertical axis, for example. In this case, the substrate W can be rotated with the back surface thereof directed upward without damaging a film formed on the top surface of the substrate W.

(3-d) Still Another Example of the Bevel Cleaner

The bevel cleaner 530 may be replaced with bevel cleaners 560 and 570 shown in FIG. 13. FIG. 13 is a diagram showing a cleaning processing unit SD1 including the bevel cleaners 560 and 570.

As shown in FIG. 13, each of the bevel cleaners 560 and 570 includes holding members 532 and 533, a brush rotation-driving mechanism 534, an arm 535, and an arm driving mechanism 536, similarly to the bevel cleaner 530 shown in FIG. 5.

The bevel cleaner 560 differs from the bevel cleaner 530 (FIG. 5) in that it includes a cleaning brush 561 in place of the cleaning brush 531. The cleaning brush 561 has an upper bevel cleaning surface 561*a* and an end surface cleaning surface 561*b* (FIG. 14) respectively corresponding to the upper bevel cleaning surface 531*a* and the end surface cleaning surface 531*b* of the cleaning brush 531.

The bevel cleaner 570 differs from the bevel cleaner 530 in that a cleaning brush 571 is provided in place of the cleaning brush 531. The cleaning brush 571 has an end surface cleaning surface 571*b* and a lower bevel cleaning surface 571*c* respectively corresponding to the end surface cleaning surface 531*b* and the lower bevel cleaning surface 531*c* of the cleaning brush 531.

When a substrate W is subjected to cleaning processing, the cleaning brushes 561 and 571 are respectively driven individually by the brush rotation-driving mechanism 534 and the arm driving mechanism 536.

Figure 14:
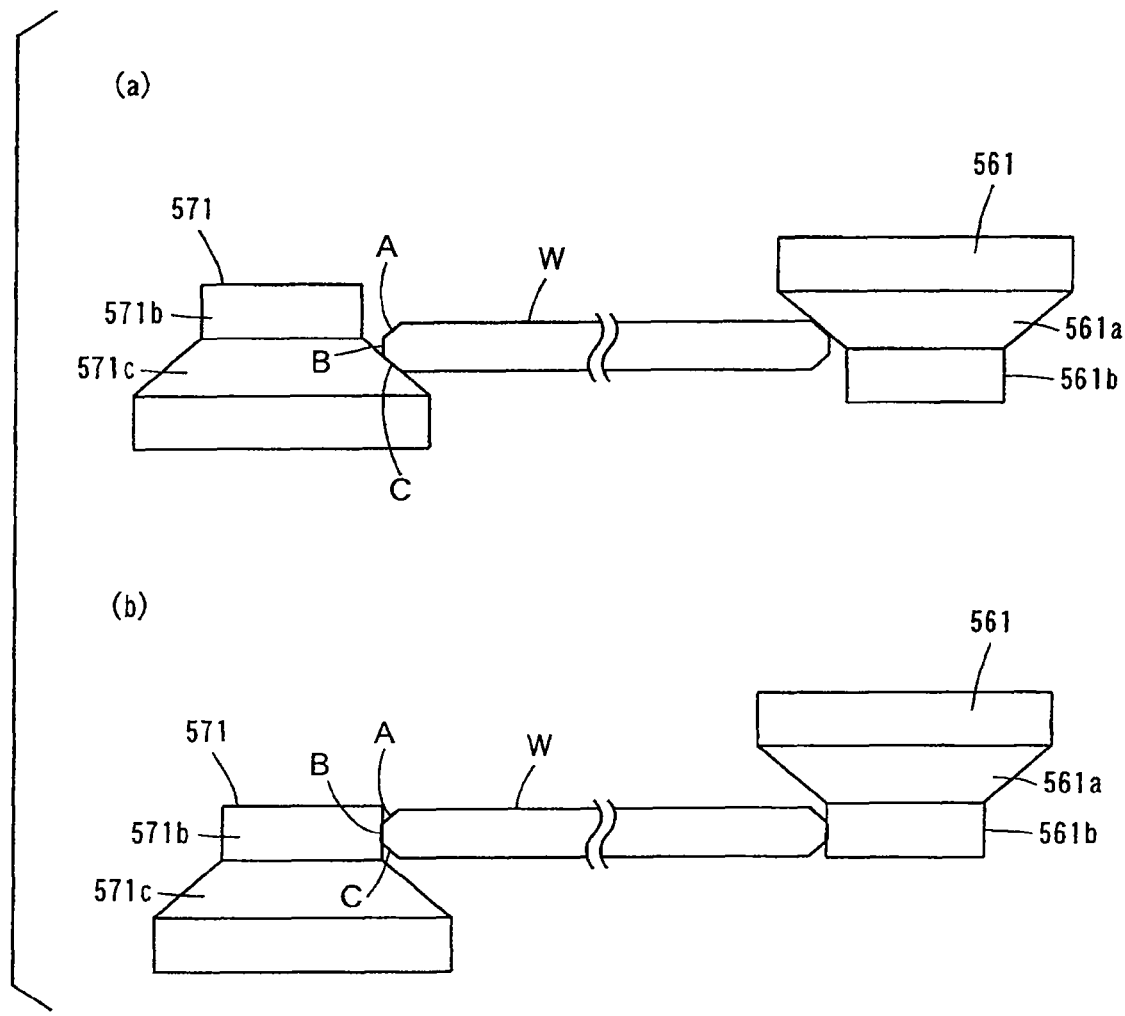
FIGS. 14(a) and 14(b) are diagrams for explaining cleaning processing of a bevel portion of a substrate using a cleaning brush in the bevel cleaner shown in FIG. 13.

FIGS. 14(*a*), 14(*b*), and 15 are diagrams for explaining cleaning processing of a bevel portion R of the substrate W by the cleaning brushes 561 and 571 in the bevel cleaners 560 and 570. As shown in FIG. 14(*a*), the upper bevel cleaning surface 561*a* of the cleaning brush 561 comes into contact with an upper bevel region A in the substrate W, and the lower bevel cleaning surface 571*c* of the cleaning brush 571 comes into contact with a lower bevel region C in the substrate W, to clean the upper bevel region A and the lower bevel region C in the substrate W.

Furthermore, as shown in FIG. 14(*b*), the end surface cleaning surface 561*b* of the cleaning brush 561 and the end surface cleaning surface 571*b* of the cleaning brush 571 come into contact with an end surface region B in the substrate W, to clean the end surface region B in the substrate W.

When the bevel cleaners 560 and 570 are thus used, the upper bevel region A and the lower bevel region C in the substrate W can be simultaneously cleaned. Therefore, a cleaning time period can be shortened, as compared with that in a case where the upper bevel region A and the lower bevel region C in the substrate W are cleaned in this order.

Figure 15:
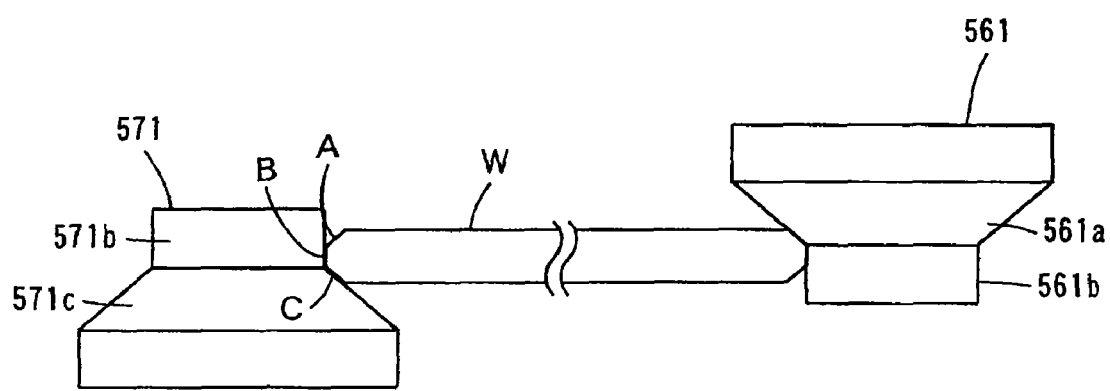
FIG. 15 is a diagram for explaining cleaning processing of a bevel portion of a substrate using a cleaning brush in the bevel cleaner shown in FIG. 13.

As shown in FIG. 15, the upper bevel cleaning surface 561*a* of the cleaning brush 561, the lower bevel cleaning surface 571*c* of the cleaning brush 571, and the respective end surface cleaning surfaces 561*b* and 571*b* of the cleaning brushes 561 and 571 may be respectively brought into contact with the upper bevel region A, the lower bevel region C, and the end surface region B simultaneously. In this case, the upper bevel region A, the end surface region B, and the lower bevel region C in the substrate W can be simultaneously cleaned.

(4) Effects of Embodiment

(4-1) Effect of Cleaning of the Bevel Portion of the Substrate

In the present embodiment, before the substrate W is subjected to the exposure processing in the exposure device 16, the bevel portion R of the substrate W before the exposure processing is cleaned in the cleaning processing unit SD1. This can prevent contamination in the exposure device due to contamination of the bevel portion R of the substrate W while preventing a defective dimension and a defective shape of the exposure pattern.

(4-2) Effect of Cleaning of the Top Surface of the Substrate

Before the substrate W is subjected to the exposure processing in the exposure device 16, the top surface of the substrate W before the exposure processing is cleaned in the cleaning processing unit SD1. During the cleaning processing, a part of the component of the resist cover film on the substrate W is eluted in the cleaning liquid and cleaned away. Even if the substrate W comes into contact with the liquid in the exposure device 16, therefore, the component of the resist cover film on the substrate W is hardly eluted in the liquid. Furthermore, it is possible to remove particles and the like that have adhered to the substrate W before the exposure processing. As a result, contamination in the exposure device 16 is prevented.

(4-3) Effect of Drying Processing of the Substrate After Exposure Processing In the drying processing unit SD2 in the interface block 15, the substrate W after the exposure processing is subjected to the drying processing. This prevents the liquid that has adhered to the substrate W during the exposure processing from dropping in the substrate processing apparatus 500.

Furthermore, the particles and the like in the atmosphere are prevented from adhering to the substrate W after the exposure processing by subjecting the substrate W after the exposure processing to the drying processing, which can prevent the substrate W from being contaminated.

The substrate W to which the liquid has adhered can be prevented from being transported in the substrate processing apparatus 500, which can prevent the liquid that has adhered to the substrate W during the exposure processing from affecting the atmosphere in the substrate processing apparatus 500. This facilitates the adjustment of temperature and humidity in the substrate processing apparatus 500.

The liquid that has adhered to the substrate W during the exposure processing is prevented from adhering to the indexer robot IR and the first to sixth central robots CR1 to CR6, which prevents the liquid from adhering to the substrate W before the exposure processing. This prevents the particles and the like in the atmosphere from adhering to the substrate W before the exposure processing, which prevents the substrate W from being contaminated. As a result, it is possible to prevent degradation in resolution performance during the exposure processing while preventing contamination in the exposure device 16.

Furthermore, the component of the resist film or the component of the resist cover film can be reliably prevented from being eluted in the cleaning liquid and the rinse liquid remaining on the substrate W while the substrate W is transported from the drying processing unit SD2 to the development processing group 70. This can prevent an exposure pattern formed on the resist film from being deformed. As a result, it is possible to reliably prevent line-width precision during the development processing from being degraded.

As a result of these, it is possible to prevent operational troubles such as abnormalities in an electric system of the substrate processing apparatus 500 while reliably preventing processing defects in the substrate W.

(4-4) Effect of Coating Processing of the Resist Cover Film

Before the substrate W is subjected to the exposure processing in the exposure device 16, the resist cover film is formed on the resist film in the resist cover film processing block 13. In this case, even if the substrate W comes into contact with the liquid in the exposure device 16, the resist cover film prevents the resist film from coming into contact with the liquid, which prevents the component of the resist film from being eluted in the liquid.

(4-5) Effect of Removal Processing of the Resist Cover Film

Before the substrate W is subjected to the development processing in the development processing block 12, the resist cover film is subjected to the removal processing in the resist cover film removal block 14. In this case, the resist cover film is reliably removed before the development processing, which allows the development processing to be reliably performed.

(4-6) Effect of Interface Transport Mechanism

In the interface block 15, the hand H1 of the interface transport mechanism IFR is used in transporting the substrate W from the placement/cooling unit P-CP to the exposure device 16 and in transporting the substrate W from the drying processing unit SD2 to the substrate platform PASS13, and the hand H2 of the interface transport mechanism IFR is used in transporting the substrate W from the exposure device 16 to the drying processing unit SD2.

That is, the hand H1 is used for transporting the substrate W having no liquid adhering thereto, and the hand H2 is used for transporting the substrate W having a liquid adhering thereto.

In this case, the liquid that has adhered to the substrate W during the exposure processing is prevented from adhering to the hand H1, which prevents the liquid from adhering to the substrate W before the exposure processing. Furthermore, the hand H2 is provided below the hand H1, which can prevent the liquid from adhering to the hand H1 and the substrate W held thereby even if the liquid drops from the hand H2 and the substrate W held thereby. This can reliably prevent the liquid from adhering to the substrate W before the exposure processing. As a result, the substrate W can be reliably prevented from being contaminated before the exposure processing.

(4-7) Effect of Disposition of Placement/Cooling Unit P-CP

The interface block 15 is provided with the placement/cooling unit P-CP having both the function of placing the substrate W before the exposure processing by the exposure device 16 and the function of cooling the substrate W for adjusting the temperature of the substrate W to the temperature in the exposure device 16, which allows the number of transporting processes to be reduced. When the exposure processing is performed by means of the liquid immersion method in which strict temperature control of the substrate is required, it is important to reduce the number of transporting processes.

As a result of the foregoing, throughput can be improved, and reliability can be improved because the number of access points for transportation can be reduced.

Particularly, the two placement/cooling units P-CP are provided, which allows the throughput to be further improved.

(5) Another Embodiment

Although in the above-mentioned embodiment, pure water is used as the cleaning liquid in the cleaning processing unit SD1, the pure water may be replaced with a surface active agent, a solvent, or an alcohol chemical liquid such as IPA (isopropyl alcohol). In this case, a higher cleaning effect can be obtained by chemical cleaning.

Furthermore, a drying processing unit SD2 may be provided with bevel cleaners 530, 560, and 570. In this case, a substrate W is dried in the drying processing unit SD2 after a bevel portion R of the substrate W before exposure processing is cleaned. The bevel portion R of the substrate W before the exposure processing is cleaned, which allows development processing to be performed with the bevel portion R of the substrate W kept sufficiently clean in the development processing block 12. This can reliably prevent development performance from being degraded due to contamination of the bevel portion R.

The cleaning processing unit SD1 or the drying processing unit SD2 may be provided in a block other than an interface block 15.

Furthermore, the respective numbers of cleaning processing units SD1 drying processing units SD2, coating units BARC, RES, and COV, development processing units DEV, reversing units RT, removal units REM, heating units HP, cooling units CP, and placement/cooling units P-CP may be appropriately changed depending on the processing speed of each of the processing blocks. In a case where two edge exposure units EEW are provided, the number of drying processing units SD2 may be set to two.

(6) Correspondence Between Constituent Elements in the Claims and Parts in Embodiments In the following paragraphs, non-limiting examples of correspondences between various elements recited in the claims below and those described above with respect to various preferred embodiments of the present invention are explained.

In the embodiments described above, the indexer block 9, the anti-reflection film processing block 10, the resist film processing block 11, the development processing block 12, the resist cover film processing block 13, and the resist cover film removal block 14 are examples of a processing section, the interface block 15 is an example of an interface, and the cleaning processing unit SD1 and the drying processing unit SD2 are examples of a substrate cleaning device.

The spin chuck 521 and the chuck rotation-driving mechanism 522 are examples of a substrate rotation holding device, the brush rotation-driving mechanism 534 is an example of a brush rotating mechanism, the cleaning brushes 531 and 540 are examples of an end portion cleaning brush, the upper bevel cleaning surface 531a is an example of a first cleaning surface of the end portion cleaning brush, the end surface cleaning surface 531b is an example of a second cleaning surface of the end portion cleaning brush, the lower bevel cleaning surface 531c is an example of a third cleaning surface of the end portion cleaning brush, and the lower surface cleaning surface 541a is an example of a fourth cleaning surface of the end portion cleaning brush.

Furthermore, the reversing unit RT is an example of a reversing device, the back surface cleaning brush 545 is an example of a surface cleaning brush, the cleaning brush 561 is an example of a first cleaning brush, the cleaning brush 571 is an example of a second cleaning brush, the upper bevel cleaning surface 561a is an example of a first cleaning surface of the first cleaning brush, the lower bevel cleaning surface 571c is an example of a second cleaning surface of the second cleaning brush, and the end surface cleaning surfaces 561b and 571b are examples of respective third cleaning surfaces of the first and second cleaning brushes.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus disposed adjacent to an exposure device that subjects a substrate to exposure processing by means of a liquid immersion method, the substrate processing apparatus comprising:
    a processing section for subjecting a substrate to processing, the substrate having one surface and another surface opposing the one surface; and
    an interface provided adjacent to one end of the processing section for receiving and transferring the substrate between the processing section and the exposure device, wherein:
        the processing section includes a photosensitive film forming unit that forms a photosensitive film made of a photosensitive material on one surface of the substrate before the exposure processing by the exposure device, and
        at least one of the processing section or the interface comprises a substrate cleaning device that cleans the substrate after the formation of the photosensitive film by the photosensitive film forming unit and before the exposure processing, by the exposure device,
    the substrate cleaning device comprising:
        a substrate rotation holding device that rotates the substrate while holding the substrate;
        a cleaning brush configured to come into contact with the substrate held in the substrate rotation holding device;
        a driving mechanism that moves the cleaning brush; and
        a brush rotating mechanism that rotates the cleaning brush around a rotating shaft in a direction substantially perpendicular to the one surface of the substrate held in the substrate rotation holding device;
    the cleaning brush comprising:
        a first cleaning surface configured to come into contact with a bevel region on a side of another surface of the substrate held by the substrate rotation holding device; and
        an annular plane-shaped second cleaning surface configured to come into contact with a peripheral portion of the another surface of the substrate held by the substrate rotation holding device, wherein the first and second cleaning surfaces are integrally provided with the rotating shaft as its center such that:
        the driving mechanism moves the cleaning brush to a position where the cleaning brush does not come into contact with the one surface of the substrate, the bevel region on the side of the one surface of the substrate, and an end surface region of the substrate, but the first and second cleaning surfaces of the cleaning brush come into contact with the bevel region on the side of the another surface of the substrate and the peripheral region of the another surface of the substrate simultaneously.

2. The substrate processing apparatus according to claim 1 wherein:
    the cleaning brush further comprises a cylindrical third cleaning surface configured to come into contact with the end surface region of the substrate held by the substrate rotation holding device, the third cleaning surface being provided integrally with the first and second cleaning surfaces with the rotating shaft as its center.

3. The substrate processing apparatus according to claim 1 wherein:

the substrate cleaning device further includes a first cleaning liquid supplier that supplies a cleaning liquid onto the top surface of the substrate held by the substrate rotation holding device.

4. The substrate processing apparatus according to claim 1 wherein:

the substrate cleaning device further includes a second cleaning liquid supplier that supplies a cleaning liquid onto the back surface of the substrate held by the substrate rotation holding device.

5. A substrate cleaning device comprising:

a substrate rotation holding device that rotates a substrate while holding the substrate;

a cleaning brush disposed to come into contact with the substrate held in the substrate rotation holding device; and a brush rotating mechanism that rotates the cleaning brush around a rotating shaft in a direction substantially perpendicular to one surface of the substrate held in the substrate rotation holding device, wherein the cleaning brush includes:

a first cleaning surface configured to come into contact with a bevel region on a side of another surface of the substrate held by the substrate rotation holding device, an annular plane-shaped second cleaning surface configured to come into contact with a peripheral portion of the another surface of the substrate held by the substrate rotation holding device, wherein the first and second cleaning surfaces are integrally provided with the rotating shaft as its center such that:

the driving mechanism moves the cleaning brush to a position where the cleaning brush does not come into contact with the one surface of the substrate, the bevel region on the side of the one surface of the substrate, and an end surface region of the substrate, but the first and second cleaning surfaces of the cleaning brush come into contact with the bevel region on the side of the another surface of the substrate and the peripheral region of the another surface of the substrate simultaneously.

6. The substrate cleaning device according to claim 5, further comprising a first cleaning liquid supplier that supplies a cleaning liquid onto the top surface of the substrate held by the substrate rotation holding device.

7. The substrate cleaning device according to claim 5, further comprising a second cleaning liquid supplier that supplies a cleaning liquid onto the back surface of the substrate held by the substrate rotation holding device.

* * * * *